(12) United States Patent
Yang et al.

(10) Patent No.: US 12,362,341 B2
(45) Date of Patent: Jul. 15, 2025

(54) SEMICONDUCTOR DEVICES AND METHODS OF MANUFACTURING

(71) Applicant: Taiwan Semiconductor Manufacturing Co., Ltd., Hsinchu (TW)

(72) Inventors: Chang-Yi Yang, Hsinchu (TW); Po-Yao Chuang, Hsinchu (TW); Shin-Puu Jeng, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 29 days.

(21) Appl. No.: 18/446,291

(22) Filed: Aug. 8, 2023

(65) Prior Publication Data

US 2023/0387100 A1 Nov. 30, 2023

Related U.S. Application Data

(60) Division of application No. 17/813,873, filed on Jul. 20, 2022, which is a continuation of application No.
(Continued)

(51) Int. Cl.
*H01L 25/18* (2023.01)
*H01L 21/48* (2006.01)
(Continued)

(52) U.S. Cl.
CPC .......... *H01L 25/18* (2013.01); *H01L 21/4853* (2013.01); *H01L 21/4857* (2013.01);
(Continued)

(58) Field of Classification Search
CPC ....................................................... H01L 24/13
See application file for complete search history.

(56) References Cited

U.S. PATENT DOCUMENTS 8,557,629 B1 * 10/2013 Kim .................... H01L 25/105
438/106
2013/0075926 A1 3/2013 Bae et al.
(Continued)

FOREIGN PATENT DOCUMENTS

CN 109786267 A 5/2019
CN 109786268 A 5/2019
(Continued)

*Primary Examiner* — Evan G Clinton
(74) *Attorney, Agent, or Firm* — Slater Matsil, LLP

(57) ABSTRACT

A method includes forming a redistribution structure including metallization patterns; attaching a semiconductor device to a first side of the redistribution structure; encapsulating the semiconductor device with a first encapsulant; forming openings in the first encapsulant, the openings exposing a metallization pattern of the redistribution structure; forming a conductive material in the openings, comprising at least partially filling the openings with a conductive paste; after forming the conductive material, attaching integrated devices to a second side of the redistribution structure; encapsulating the integrated devices with a second encapsulant; and after encapsulating the integrated devices, forming a pre-solder material on the conductive material.

20 Claims, 30 Drawing Sheets

Related U.S. Application Data

17/097,301, filed on Nov. 13, 2020, now Pat. No. 11,410,982.

(60) Provisional application No. 63/001,912, filed on Mar. 30, 2020.

(51) Int. Cl.
| | |
|---|---|
| H01L 23/498 | (2006.01) |
| H01L 23/538 | (2006.01) |
| H01L 25/00 | (2006.01) |
| H01L 25/16 | (2023.01) |
| H01L 21/683 | (2006.01) |

(52) U.S. Cl.
CPC .. *H01L 23/49816* (2013.01); *H01L 23/49822* (2013.01); *H01L 23/5383* (2013.01); *H01L 25/165* (2013.01); *H01L 25/50* (2013.01); H01L 21/6835 (2013.01); H01L 2221/68345 (2013.01); H01L 2221/68359 (2013.01)

(56) References Cited

U.S. PATENT DOCUMENTS

| | | | |
|---|---|---|---|
| 2013/0168805 | A1 | 7/2013 | Yu et al. |
| 2014/0063768 | A1 | 3/2014 | Tanaka et al. |
| 2015/0325543 | A1* | 11/2015 | Katkar ............... H01L 24/13 |
| | | | 219/121.64 |
| 2016/0013172 | A1 | 1/2016 | Lin et al. |
| 2016/0049389 | A1 | 2/2016 | Chen et al. |
| 2016/0233196 | A1 | 8/2016 | Kim et al. |
| 2017/0221868 | A1* | 8/2017 | Kim ............... H01L 25/0657 |
| 2017/0294389 | A1 | 10/2017 | Factor et al. |
| 2018/0033771 | A1 | 2/2018 | Yu et al. |
| 2018/0068937 | A1 | 3/2018 | Marimuthu et al. |
| 2018/0090471 | A1* | 3/2018 | Chiu ..................... H01L 25/50 |
| 2018/0130771 | A1 | 5/2018 | Hu et al. |
| 2018/0269188 | A1 | 9/2018 | Yu et al. |
| 2018/0323170 | A1* | 11/2018 | Kim ..................... H01L 23/31 |
| 2019/0148250 | A1 | 5/2019 | Yu et al. |
| 2019/0148301 | A1 | 5/2019 | Huang et al. |
| 2019/0044943 | A1 | 8/2019 | Fan |
| 2019/0295972 | A1 | 9/2019 | Tsai et al. |
| 2020/0006220 | A1 | 1/2020 | Pan et al. |
| 2020/0075562 | A1 | 3/2020 | Yu et al. |

FOREIGN PATENT DOCUMENTS

| | | |
|---|---|---|
| CN | 110660753 A | 1/2020 |
| TW | I656614 B | 4/2019 |
| TW | 201917847 A | 5/2019 |

* cited by examiner

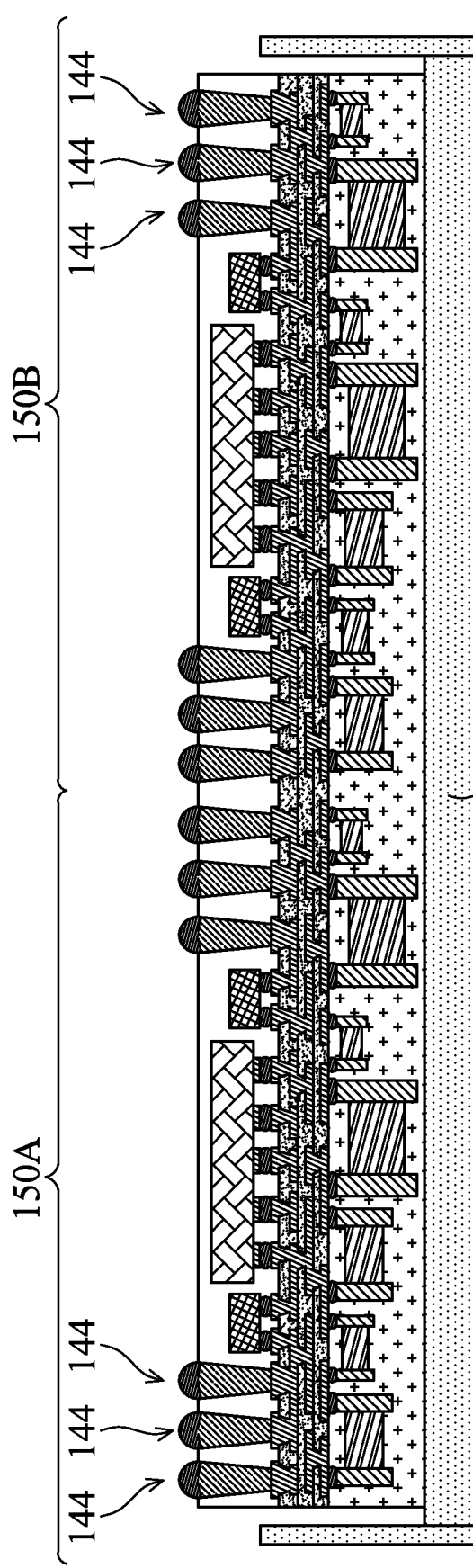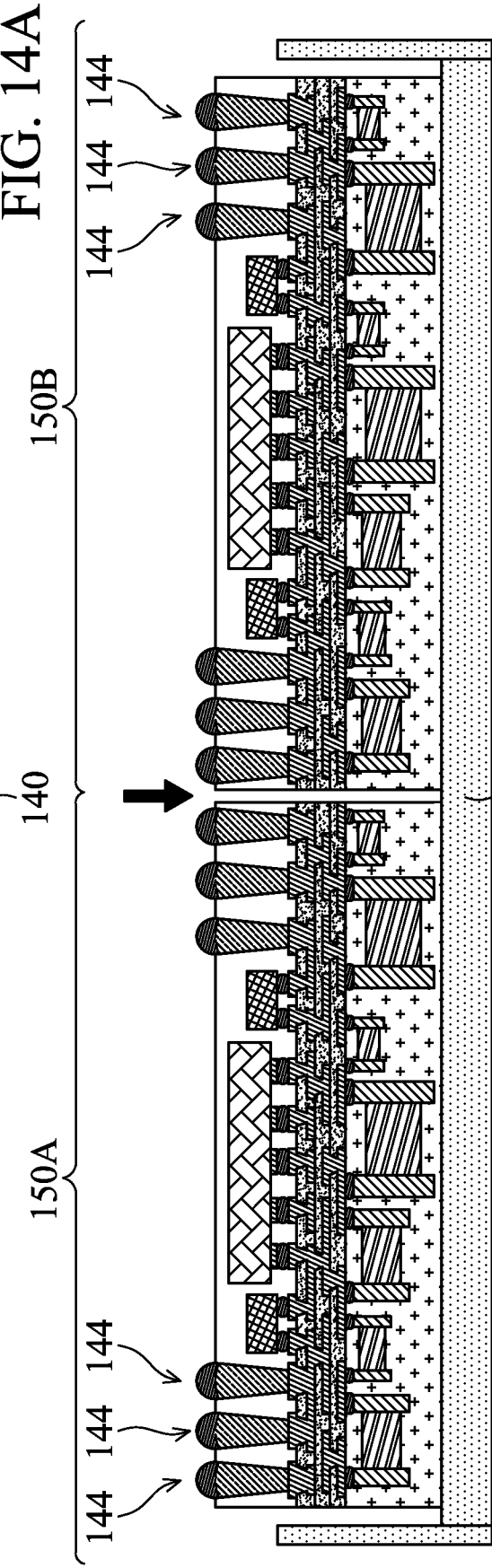

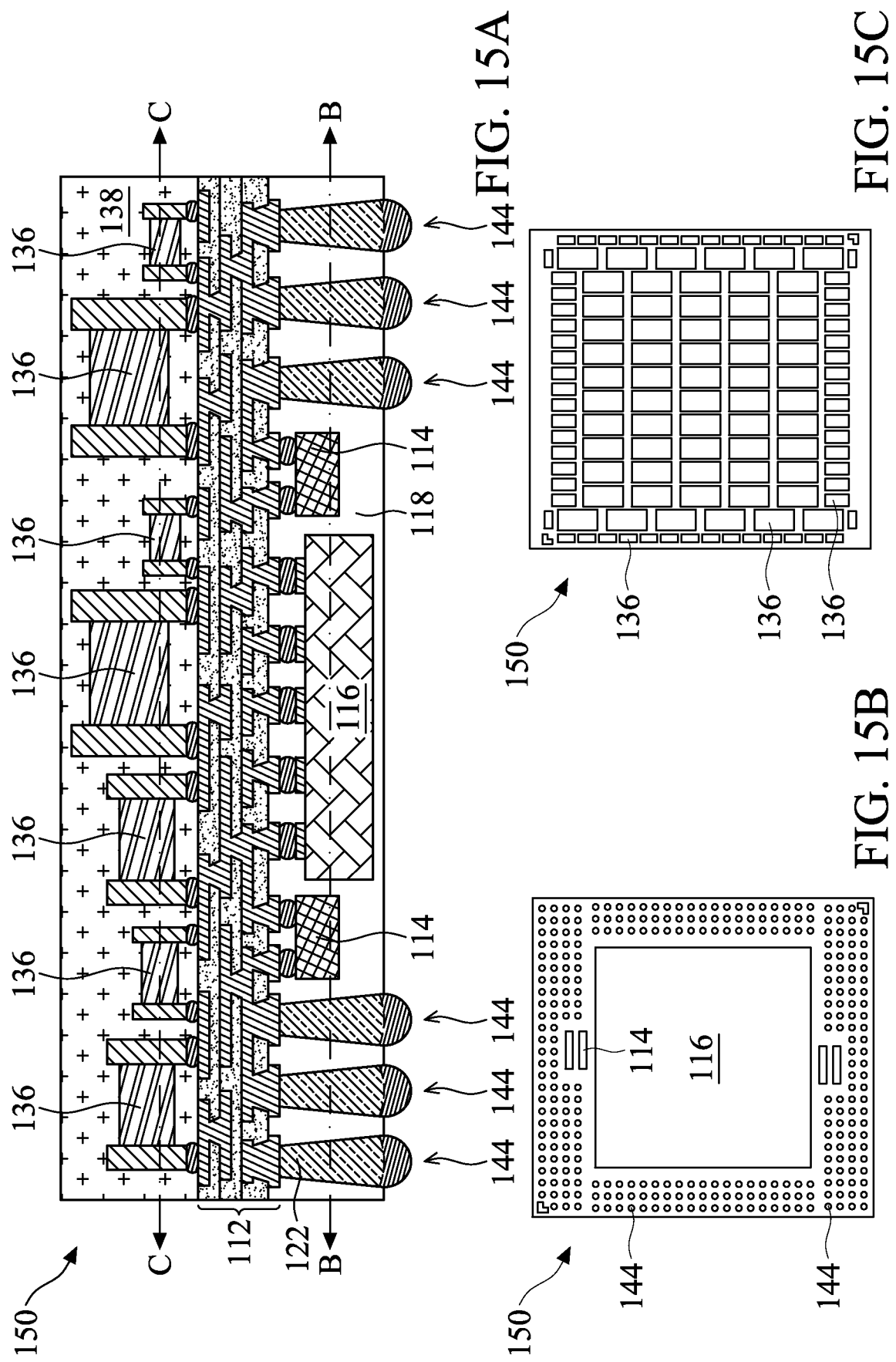

SEMICONDUCTOR DEVICES AND METHODS OF MANUFACTURING

PRIORITY CLAIM AND CROSS-REFERENCE

This application is a divisional of U.S. patent application Ser. No. 17/813,873, entitled "Semiconductor Devices and Methods of Manufacturing," and filed Jul. 20, 2022, which is a continuation of U.S. patent application Ser. No. 17/097,301, entitled "Semiconductor Devices and Methods of Manufacturing," and filed Nov. 13, 2020, now U.S. Pat. No. 11,410,982, issued on Aug. 9, 2022, which claims the benefit of U.S. Provisional Application No. 63/001,912, entitled "Dual Side Interconnection TMV Structure for 3D SiP," and filed on Mar. 30, 2020, which applications are hereby incorporated herein by reference.

BACKGROUND

The semiconductor industry continues to improve the integration density of various electronic components (e.g., transistors, diodes, resistors, capacitors, etc.) by continual reductions in minimum feature size, which allow more components, hence more functions, to be integrated into a given area. Integrated circuits with high functionality require many input/output pads. Yet, small packages may be desired for applications where miniaturization is important.

Fan Out package technology is becoming increasingly popular, in which integrated circuits are packaged in packages that typically include a redistribution layer that is used to fan-out wiring for contact pads of the package, so that electrical contacts can be made on a larger pitch than contact pads of the integrated circuit. Such resulting package structures provide for high functional density with relatively low cost and high performance packages. As the demand for shrinking electronic devices has grown, a need for smaller and more creative packaging techniques of semiconductor dies has emerged.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1, 2, 3, 4, 5, 6, 7, 8, 9, 10, 11, 12, 13A, 13B, 13C, 14A, 14B, 15A, 15B, 15C, and 16 illustrate cross-sectional views and plan views of intermediate steps in the formation of a package structure, in accordance with some embodiments.

DETAILED DESCRIPTION

Figure 1:
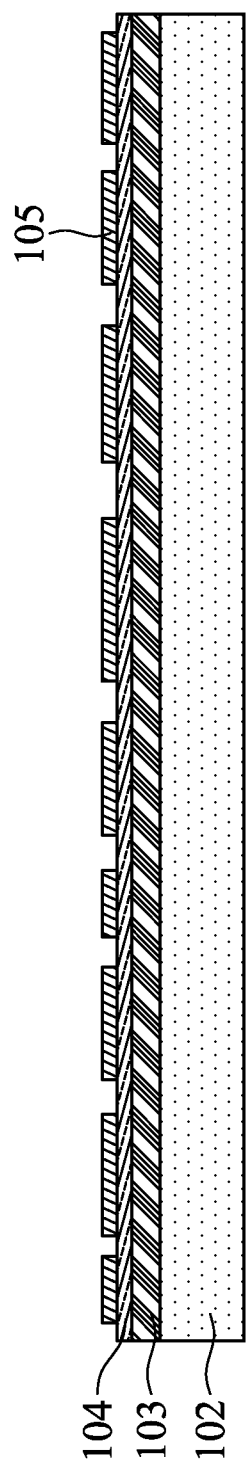

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In this disclosure, various aspects of a package structure and the formation thereof are described. The package structure may be, for example, a System-in-Package (SiP) device. In some embodiments, the system-in-package device may integrate heterogeneous devices integrated on opposing sides of a redistribution structure in a face-to-face arrangement. As such, the package structure may be formed as an asymmetric dual-sided molded package on a multi-layered RDL structure. The package structure may be formed having interconnects that include through-molding vias (TMVs) that extend through the molding of one side to connect to a redistribution structure. Techniques described herein allow for the interconnects to be formed having a smaller pitch, and thus package structure may be connected to another device using a greater number or density of connections. The interconnects may be formed having a greater pitch without increased risk of bridging or other process defects. Additionally, the techniques described herein allow for improved flexibility of design, such as exposed devices on one or both sides of the package structure, different molding materials on either side of the package structure, different thicknesses on either side of the package structure, and smaller allowed interconnect pitch. In some cases, the molding materials or thicknesses may be chosen to reduce or minimize warpage of the package structure, and thus yield or reliability may be improved.

Turning to FIG. 1, there is shown a first carrier substrate 102 on which a metallization pattern 105 has been formed, in accordance with some embodiments. The metallization pattern 105 may be part of a redistribution structure 112 (see FIG. 2). The first carrier substrate 102 may include, for example, silicon-based materials, such as a silicon substrate (e.g., a silicon wafer), a glass material, silicon oxide, or other materials, such as aluminum oxide, the like, or a combination. In some embodiments, the first carrier substrate 102 may be a panel structure, which may be, for example, a supporting substrate formed from a suitable dielectric material, such as a glass material, a plastic material, or an organic material. The panel structure may be, for example, a rectangular panel.

Figure 8:
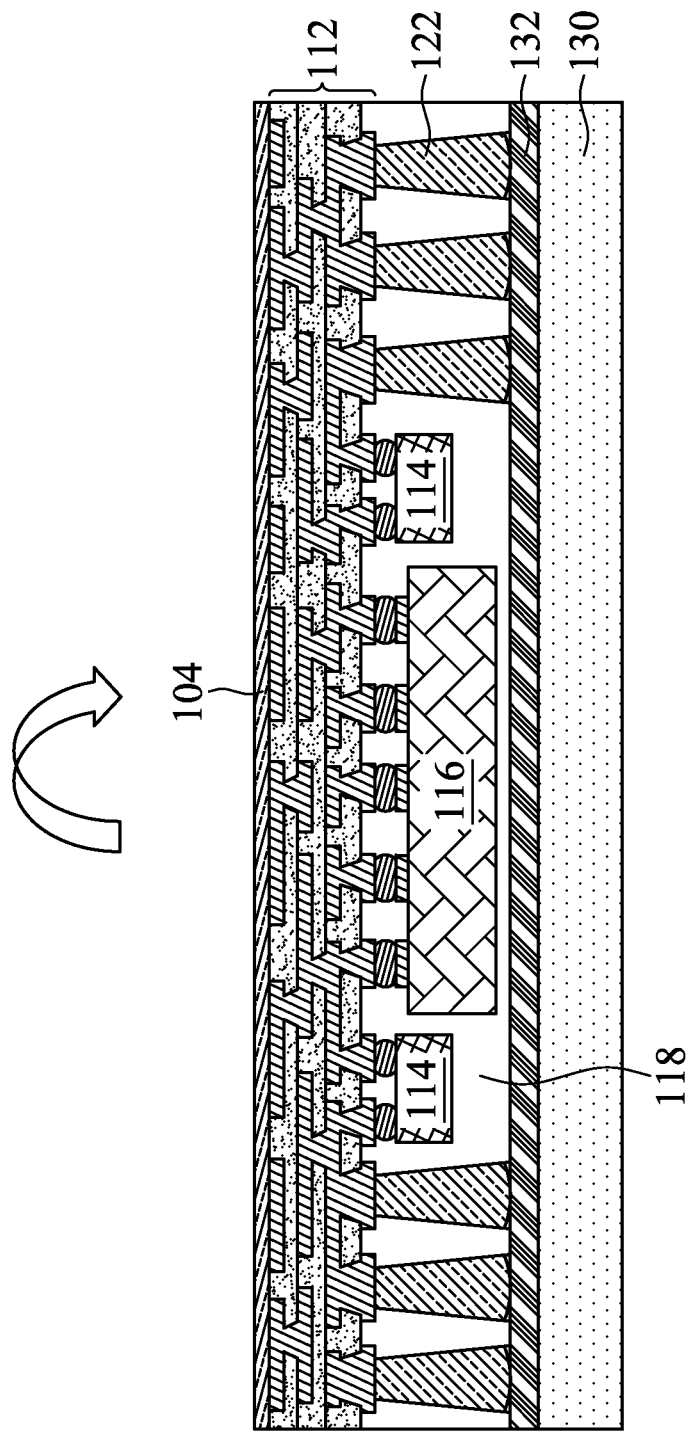

In some embodiments, a release layer 103 may be formed on the top surface of the first carrier substrate 102 to facilitate subsequent debonding of first carrier substrate 102 (see FIG. 8). The release layer 103 may be formed of a polymer-based material, which may be removed along with the first carrier substrate 102 from the overlying structures that will be formed in subsequent steps. In some embodiments, the release layer 103 is an epoxy-based thermal-release material, which loses its adhesive property when heated, such as a light-to-heat-conversion (LTHC) release coating. In other embodiments, the release layer 103 may be an ultra-violet (UV) glue, which loses its adhesive property when exposed to UV lights. The release layer 103 may be dispensed as a liquid and cured, may be a laminate film laminated onto the first carrier substrate 102, or may be the like. The top surface of the release layer 103 may be leveled and may have a high degree of planarity. In some embodiments, a die attach film (DAF) (not shown) may be used instead of or in addition to the release layer 103.

A dielectric layer 104 may be formed on the release layer 103, in some embodiments. The bottom surface of the dielectric layer 104 may be in contact with the top surface of the release layer 103. In some embodiments, the dielectric layer 104 is formed of a polymer, such as polybenzoxazole (PBO), polyimide, benzocyclobutene (BCB), or the like. In other embodiments, the dielectric layer 104 is formed of a nitride such as silicon nitride; an oxide such as silicon oxide, phosphosilicate glass (PSG), borosilicate glass (BSG), boron-doped phosphosilicate glass (BPSG), or the like; or the like. The dielectric layer 104 may be formed by any acceptable deposition process, such as spin coating, CVD, laminating, the like, or a combination thereof.

The metallization pattern 105 of the redistribution structure 112 may be formed on the dielectric layer 104. The metallization pattern 105 may comprise, for example, conductive lines, redistribution layers or redistribution lines, contact pads, or other conductive features extending over a major surface of the dielectric layer 104. As an example, to form the metallization pattern 105, a seed layer is formed over the dielectric layer 104. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, physical vapor deposition (PVD) or the like. A photoresist is then formed and patterned on the seed layer. The photoresist may be formed by spin coating or the like and may be exposed to light for patterning. The pattern of the photoresist corresponds to the metallization pattern 105. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. Then, the photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the metallization pattern 105. Other techniques of forming the metallization pattern 105 are possible.

Figure 2:
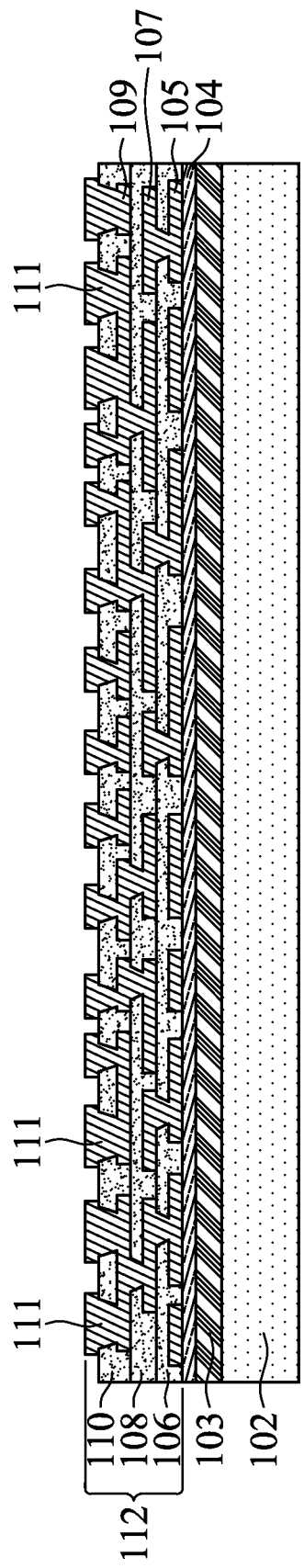

In FIG. 2, additional dielectric layers and metallization patterns (sometimes referred to as redistribution layers or redistribution lines) of the redistribution structure 112 are formed over the dielectric layer 104 and the metallization pattern 105, in accordance with some embodiments. The redistribution structure 112 shown in FIG. 2 includes additional dielectric layers 106, 108, and 110; and additional metallization patterns 107, 109, and 111. The redistribution structure 112 is shown as an example, and more or fewer dielectric layers and metallization patterns may be formed in the redistribution structure 112. If fewer dielectric layers and metallization patterns are to be formed, some steps and processes discussed below may be omitted. If more dielectric layers and metallization patterns are to be formed, some steps and processes discussed below may be repeated.

The dielectric layer 106 may be deposited on the dielectric layer 104 and the metallization pattern 105. In some embodiments, the dielectric layer 106 is formed of a polymer, such as polybenzoxazole (PBO), polyimide, benzocyclobutene (BCB), or the like. The polymer may be a photo-sensitive material that may be patterned using a lithography mask. In other embodiments, the dielectric layer 106 is formed of a nitride such as silicon nitride; an oxide such as silicon oxide, phosphosilicate glass (PSG), borosilicate glass (BSG), boron-doped phosphosilicate glass (BPSG), or the like; or the like. The dielectric layer 106 may be formed by any acceptable deposition process, such as spin coating, CVD, laminating, the like, or a combination thereof. The dielectric layer 106 is then patterned to form openings exposing portions of the metallization pattern 105. The patterning may be formed by an acceptable process, such as by exposing the dielectric layer 106 to light when the dielectric layer 106 is a photo-sensitive material or by etching using, for example, an anisotropic etch. If the dielectric layer 106 is a photo-sensitive material, the dielectric layer 106 can be developed after the exposure.

The metallization pattern 107 may be formed on the dielectric layer 106. As an example, to form metallization pattern 107, a seed layer is formed over the dielectric layer 106. A photoresist is then formed and patterned on the seed layer. The photoresist may be formed by spin coating or the like and may be exposed to light for patterning. The pattern of the photoresist corresponds to the metallization pattern 107. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. Then, the photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the metallization pattern 107. In some embodiments, the metallization pattern 107 has a different size than the metallization pattern 105. For example, the conductive lines and/or vias of the metallization pattern 107 may be wider or thicker than the metallization pattern 105. Further, the metallization pattern 107 may be formed to a greater pitch than the metallization pattern 105.

The remaining dielectric layers (e.g., the dielectric layers 108 and 110) and metallization patterns (e.g., the metallization patterns 109 and 111) of the redistribution structure 112 may be formed in a similar manner as the dielectric layer 106 and the metallization pattern 107. The metallization patterns may include one or more conductive elements. The conductive elements may be formed during the formation of the metallization pattern by forming the seed layer and conductive material of the metallization pattern over a surface of the underlying dielectric layer and in the opening of the underlying dielectric layer, thereby interconnecting and electrically coupling various conductive lines.

The metallization pattern 111 is the topmost metallization pattern of the redistribution structure 112. As such, all of the intermediate metallization patterns of the redistribution structure 112 (e.g., the metallization patterns 109 and 107) are disposed between the metallization pattern 111 and the metallization pattern 105. In some embodiments, the metallization pattern 111 has a different size than the metallization patterns 109 and/or 107. For example, the conductive lines and/or vias of the metallization pattern 111 may be wider or thicker than the conductive lines and/or vias of the metallization patterns 109 and/or 107. Further, the metallization pattern 111 may be formed to a greater pitch than the metallization pattern 109 and/or 107.

In some embodiments, the metallization patterns 111 may be under-bump metallization structures (UBMs) or may include UBMs of the redistribution structure 112. The UBMs may have bump portions on and extending along the major surface of the dielectric layer 110, and may have via portions extending through the dielectric layer 110 to physically and electrically couple the metallization pattern 109. The UBMs may be formed of the same material as the metallization pattern 109.

Figure 3:
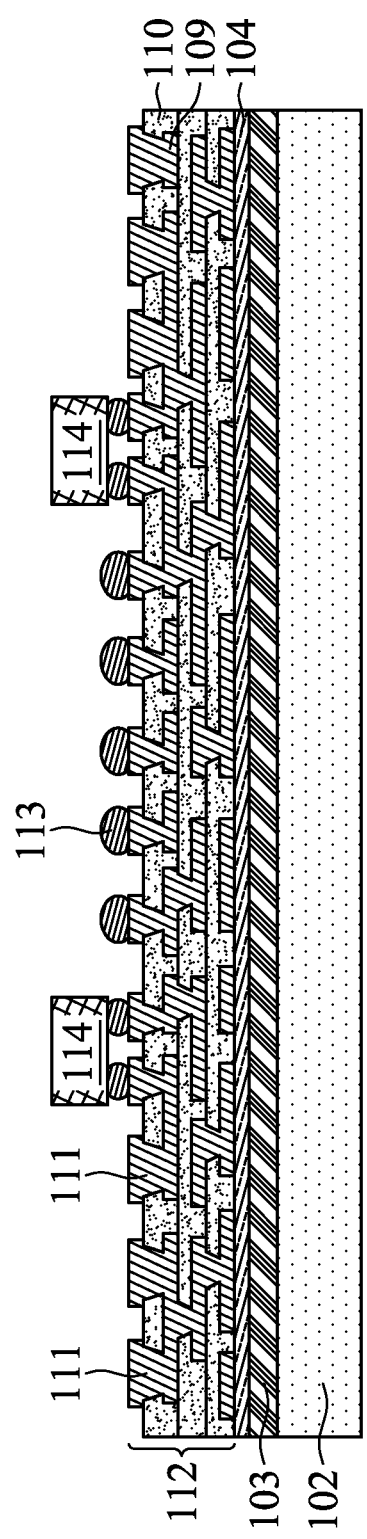

Turning to FIG. 3, integrated devices 114 and/or connectors 113 may be attached to the topmost metallization pattern 111 (or UBMs, if present) of the redistribution structure 112, in accordance with some embodiments. The integrated devices 114 may be, for example, a semiconductor device or other device that includes one or more passive devices such as capacitors, resistors, inductors, and the like. The integrated devices 114 may include, for example, an integrated passive device (IPD), a Multi-Layer Ceramic Capacitor (MLCC), a voltage regulator, or another type of device. The integrated devices 114 attached to the redistribution structure 112 may be similar devices or may be different types of devices. FIG. 3 illustrates the placement of two integrated devices 114, but in other embodiments more or fewer integrated devices 114 may be attached, and in other embodiments the integrated devices 114 are not present. The integrated devices 114 may be attached by, for example, sequentially dipping connectors (e.g., conductive bumps or pads) of the integrated devices 114 such as solder balls (not shown) into flux, and then using a pick-and-place tool in order to physically align the connectors of the integrated devices 114 with corresponding regions of the redistribution structure 112. In some cases, a reflow process may be performed to bond the connectors of the integrated devices 114. In some cases, the reflow process may be performed on both the integrated devices 114 and the connectors 113.

In some embodiments, the connectors 113 are formed on regions of the topmost metallization pattern 111 (or UBMs, if present) of the redistribution structure 112 to make subsequent connection to one or more semiconductor devices 116, described below. The connectors 113 may be formed, for example, by placing solder balls or depositing solder onto regions of the topmost metallization pattern 111. A reflow process may then be performed, forming the connectors 113. In other embodiments, forming the connectors 113 includes performing a plating step to form solder layers over regions of the topmost metallization pattern 111. In some embodiments, the connectors 113 may also include non-solder metal pillars or metal pillars. Solder caps may be formed over the non-solder metal pillars, which may be formed using plating. In other embodiments, connectors 113 are not formed prior to attachment of the semiconductor devices 116. FIG. 3 illustrates the placement of two integrated devices 114, but in other embodiments more or fewer integrated devices 114 may be attached, and in other embodiments the integrated devices 114 are not present.

Figure 4:
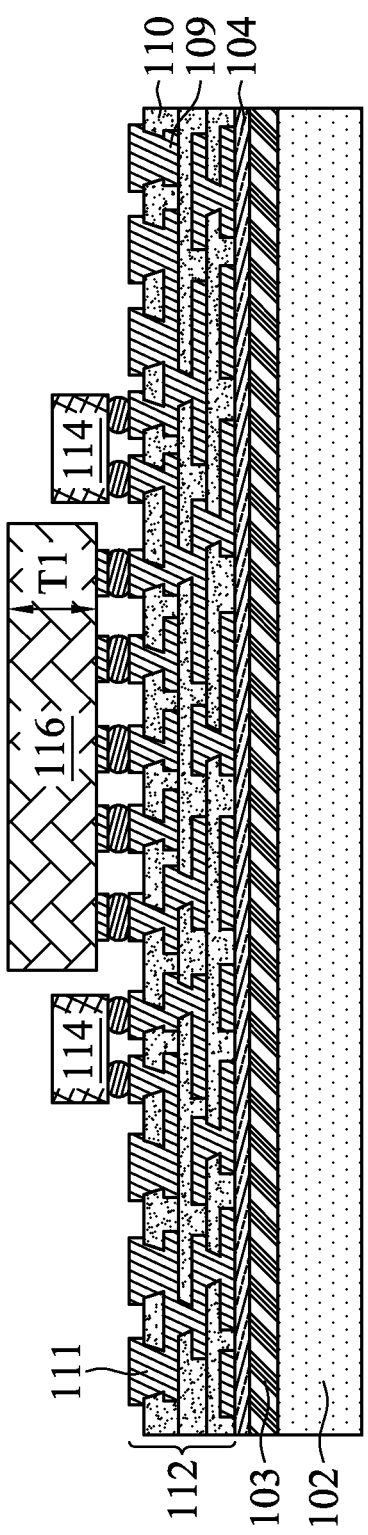

In FIG. 4, one or more semiconductor devices 116 are attached to the connectors 113, in accordance with some embodiments. The semiconductor devices 116 may include, for example, a die (e.g., an integrated circuit die, power integrated circuit die, logic die, or the like), a chip, a semiconductor device, a memory device (e.g., a memory stack, DRAM, Flash memory, High-Bandwidth Memory (HBM), or the like), another type of electronic device, a system-on-a-chip (SoC), a component on a wafer (CoW), a package comprising one or more dies or devices, the like, or a combination thereof. In some embodiments, the semiconductor devices 116 may include more than one of the same type of device, or may include different devices. FIG. 4 illustrates the placement of a single semiconductor device 116, but in other embodiments two or more semiconductor devices 116 may be attached.

The semiconductor devices 116 may comprise device connectors for external connection to the redistribution structure 112. The device connectors may be, for example, conductive pads or pillars, comprise a metal (e.g., copper) and are mechanically and electrically connected to the internal components of the semiconductor devices 116. Once formed, the semiconductor devices 116 may be tested and identified as the known-good-dies (KGD) prior to attachment to the redistribution structure 112. The semiconductor devices 116 may be attached by, for example, using a pick-and-place tool in order to physically align the device connectors of the semiconductor devices 116 with corresponding connectors 113. A reflow process may be performed to bond the device connectors to the connectors 113. In some embodiments, the connectors 113 are formed on the device connectors of the semiconductor devices 116 instead of on the redistribution structure 112. The semiconductor devices 116 may be attached to the redistribution structure 112 before attaching the integrated devices 114, in some embodiments. In some embodiments, a semiconductor device 116 has a thickness T1 that is in a range between about 100 μm and about 500 μm.

Figure 5:
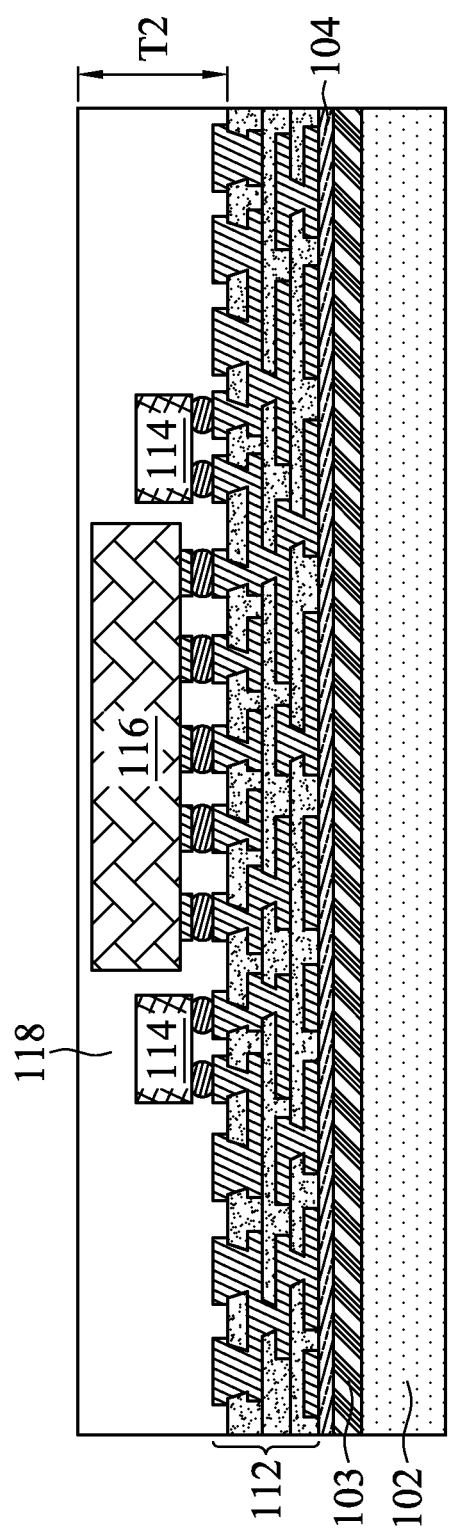

In FIG. 5, a first encapsulant 118 is formed over the redistribution structure 112 to encapsulate the integrated devices 114 and the semiconductor device 116. The first encapsulant 118 may be a molding compound such as a resin, epoxy, polyimide, PPS, PEEK, PES, underfill, another material, the like, or a combination thereof. In some embodiments, the first encapsulant 118 may be applied using compression molding, transfer molding, or the like, although other application techniques are possible. In some embodiments, the first encapsulant 118 is cured. In some embodiments, the first encapsulant 118 has a coefficient of thermal expansion (CTE) in a range between about 10 ppm/K and about 60 ppm/K. However, the first encapsulant 118 may have any suitable CTE inside or outside of this example range. In some embodiments, the material of the first encapsulant 118 may be chosen to have a CTE that reduces or minimizes warpage of a package structure, such as package structure 150 shown in FIG. 15A. For example, the material of the first encapsulant 118 may be chosen to have a CTE that is close to the CTE of the semiconductor device 116 and/or the integrated devices 114. In this manner, the first encapsulant 118 has a proportional thermal expansion that is similar to that of the semiconductor device 116 and/or integrated devices 114, and the risk of cracking or warping may be reduced. In some cases, this can reduce the warping of the redistribution structure 112 or a package structure 150 (see FIGS. 13A-C). In some cases, the material of the first encapsulant 118 may be chosen to have a particular CTE based on the CTE of the material of the second encapsulant 138, described below for FIG. 11 in greater detail. In some embodiments, the first encapsulant 118 may have thickness T2 that is in a range between about 150 μm and about 1000 μm. In some embodiments, the first encapsulant 118 is planarized (e.g., using a CMP and/or grinding process), which may expose at least one semiconductor device 116. An embodiment including a planarized first encapsulant 118 with an exposed semiconductor device 116 is described below for FIG. 16.

Figure 6:
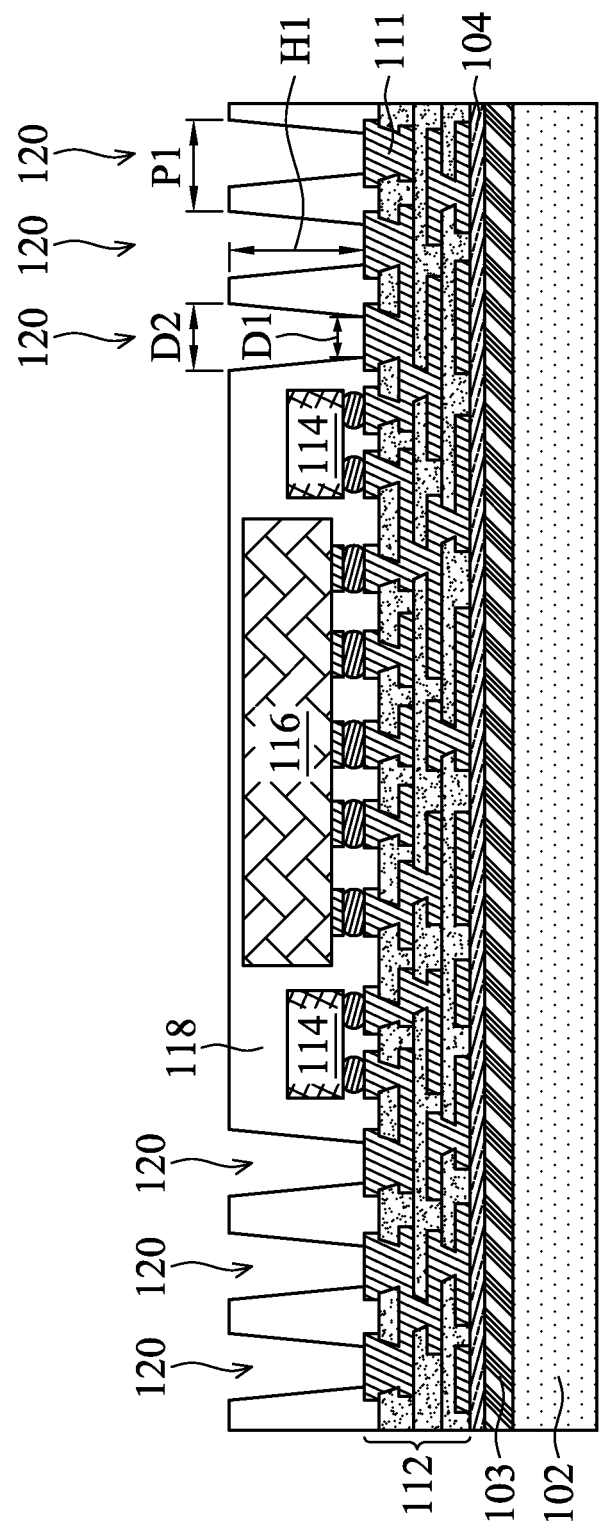

In FIG. 6, openings 120 are formed in the first encapsulant 118, in accordance with some embodiments. The openings 120 extend through the first encapsulant 118 to expose conductive regions of the redistribution structure 112. For example, the openings 120 may expose the topmost metallization pattern (e.g., metallization pattern 111) or UBMs (if present). In some embodiments, the openings 120 may be formed using a laser drilling process. The laser drilling process may include an energy in a range between about 0.1 mJ and about 0.2 mJ, in some embodiments. Other energies may be used. In some embodiments, a cleaning process (e.g., a wet clean) may be performed after the laser drilling process to remove residue. Other techniques may be used for forming the openings 120.

The openings 120 may have substantially vertical profile or may have a tapered profile, as shown in FIG. 6. For example, in some embodiments, the openings 120 may have a bottom width D1 that is about the same as the top width D2, or the bottom width D1 may be smaller than the top width D2. In some embodiments, the openings 120 may have a bottom width D1 that is in a range between about 50 μm and about 300 μm and a top width D2 that is in a range between about 60 μm and about 360 μm, though other widths are possible. In some embodiments, the ratio of D1:D2 may be between about 1:1 and about 1:1.2, though other ratios are possible. In some cases, forming the openings 120 with a vertical or tapered profile may allow for improved filling of the openings 120 by conductive material 122 (see FIG. 7).

In some embodiments, openings 120 may have a height H1 that is in a range between about 100 μm and about 1500 μm, though other heights are possible. The openings 120 may have an aspect ratio D1:H1 that is in a range between about 1:8 and about 1:10, though other aspect ratios are possible. In some cases, forming the openings 120 with a smaller top width D2 or a taller aspect ratio D1:H1 (e.g., having a relatively larger H1) can allow for the openings 120 to be formed having a smaller pitch P1. In some embodiments, the openings 120 may be formed having a pitch P1 that is in a range between about 100 μm and about 250 μm, though other pitches are possible. In some cases, the shape, size, or aspect ratio of the openings 120 may be controlled by controlling the characteristics (e.g., power, area, duration, etc.) of the laser drilling process. In this manner, the subsequently formed interconnects 144 (see FIGS. 13A-C) may be formed having a smaller width or a smaller pitch, and thus the techniques herein can allow for a greater density of interconnects 144 to be formed on a side of a package structure (e.g., the package structure 150 of FIGS. 13A-C). Other widths, dimensions, aspect ratios, or profiles are possible.

Figure 7:
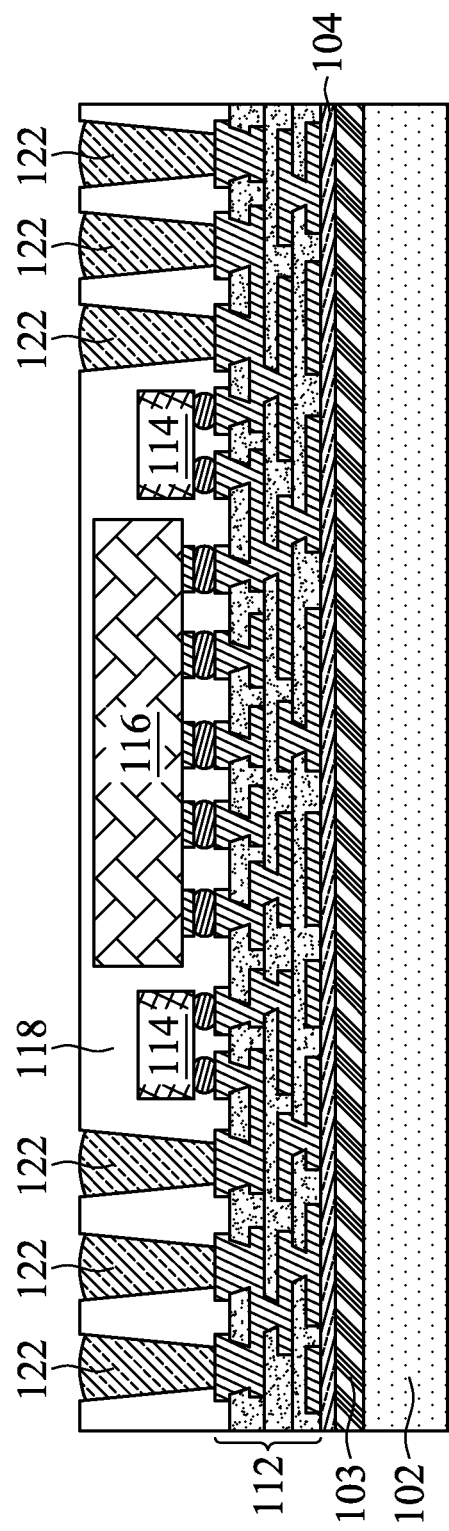

Turning to FIG. 7, conductive material 122 is deposited into the openings 120, in accordance with some embodiments. The conductive material 122 in the openings 120 makes physical and electrical contact with the topmost metallization pattern (e.g., metallization pattern 111) or UBMs (if present) of the redistribution structure 112. The conductive material 122 may extend partially or fully through the first encapsulant 118. In some cases, the conductive material 122 within the openings 120 may be considered through-molding vias (TMVs). In some embodiments, the conductive material 122 may comprise a conductive paste such as solder paste, silver paste, silver glue or adhesive, the like, or combinations thereof. The conductive material 122 may be deposited using, for example, a suitable dispensing process or a printing process. A reflow may be performed after depositing the conductive material 122.

In some embodiments, conductive material 122 may have a height H2 that is in a range between about 100 μm and about 1500 μm, though other heights are possible. For example, the height H2 may be based on the height H1 of the openings 120, and the height H2 may be greater than, about the same as, or less than the height H1. The conductive material 122 may partially fill the openings 120 or may completely fill the openings 120. Accordingly, a top surface of the conductive material 122 may be below a top surface of the first encapsulant 118, may be about level with a top surface of the first encapsulant 118, or may protrude above a top surface of the first encapsulant 118. For example, a top surface of the conductive material 122 may be below a top surface of the first encapsulant 118 a distance in a range between about 30 μm and about 100 μm or a top surface of the conductive material 122 may be above a top surface of the first encapsulant 118 a distance in a range between about 30 μm and about 100 μm. Other distances are possible. The top surface of the conductive material 122 may be concave, substantially flat, convex, or have another shape.

In FIG. 8, a carrier substrate de-bonding is performed to detach (or "de-bond") the first carrier substrate 102 from the redistribution structure 112 (e.g., the dielectric layer 106), in accordance with some embodiments. The de-bonding may include projecting a light such as a laser light or an UV light on the release layer 103 so that the release layer 103 decomposes under the heat of the light and the first carrier substrate 102 can be removed. The structure may then flipped be over and attached to a second carrier substrate 130. The second carrier substrate 130 may be a carrier substrate similar to those described above for the first carrier substrate 102. A release layer 132 may be formed on the second carrier substrate 130 to facilitate attachment of the structure to the second carrier substrate 130. The release layer 132 may be similar to the release layer 103 described previously. For example, in some embodiments, the release layer 132 may be a DAF or the like.

Figure 9:
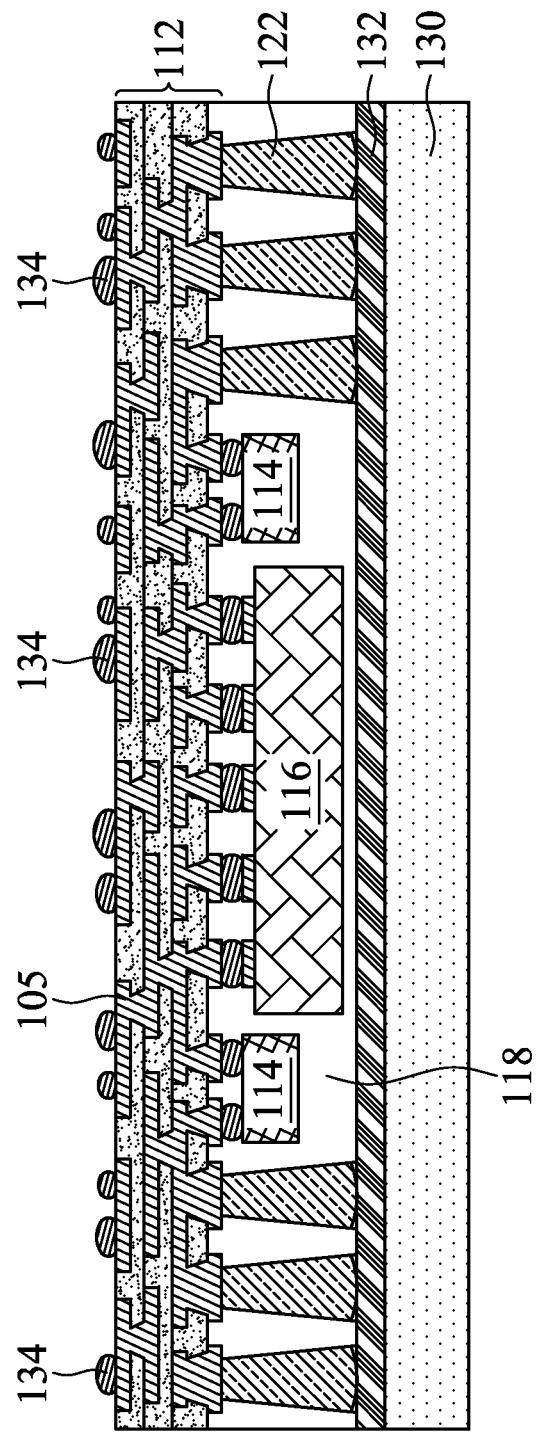

In FIG. 9, conductive connectors 134 are formed on the redistribution structure 112, in accordance with some embodiments. The conductive connectors 134 make physical and electrical contact with the bottom metallization pattern (e.g., metallization pattern 105) of the redistribution structure 112. The dielectric layer 104 may be removed, for example, using a suitable etching process. In other embodiments, portions of the dielectric layer 104 are left remaining after forming the conductive connectors 134. In some embodiments, the conductive connectors 134 are formed by forming openings through the dielectric layer 104 to expose portions of the metallization pattern 105. The openings may be formed, for example, using laser drilling, etching, or the like. The conductive connectors 134 are then formed in the openings in the dielectric layer 104. The remaining portions of the dielectric layer 104 may be left remaining on the redistribution structure 112 or may be removed after forming the conductive connectors 134. In some embodiments, the dielectric layer 104 is removed before forming the conductive connectors 134. The dielectric layer 104 or portions thereof may be removed using, for example, a suitable etching process.

In some embodiments, a pre-solder printing process may be performed on the metallization pattern 105 prior to forming the conductive connectors 134 on the metallization pattern 105. The conductive connectors 134 may be, for example, ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 134 comprise a conductive material such as solder, copper, aluminum, gold, nickel, silver, palladium, tin, the like, or a combination thereof. In some embodiments, the conductive connectors 134 are formed by initially forming a layer of solder through evaporation, electroplating, printing, solder transfer, ball placement, or the like. Once a layer of solder has been formed on the structure, a reflow may be performed in order to shape the material into the desired bump shapes. In some embodiments, the conductive connectors 134 comprise flux and are formed, for example, using a flux dipping process. In some embodiments, the conductive connectors 134 comprise a conductive paste such as solder paste, silver paste, or the like, and are dispensed in a printing process. In another embodiment, the conductive connectors 134 comprise metal pillars (such as a copper pillar) formed by a sputtering, printing, electro plating, electroless plating, CVD, or the like. The metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process. In some embodiments, the conductive connectors 134 are formed in a manner similar to the connectors 113, and may be formed of a similar material as the connectors 113. Other materials or techniques are possible.

Figure 10:
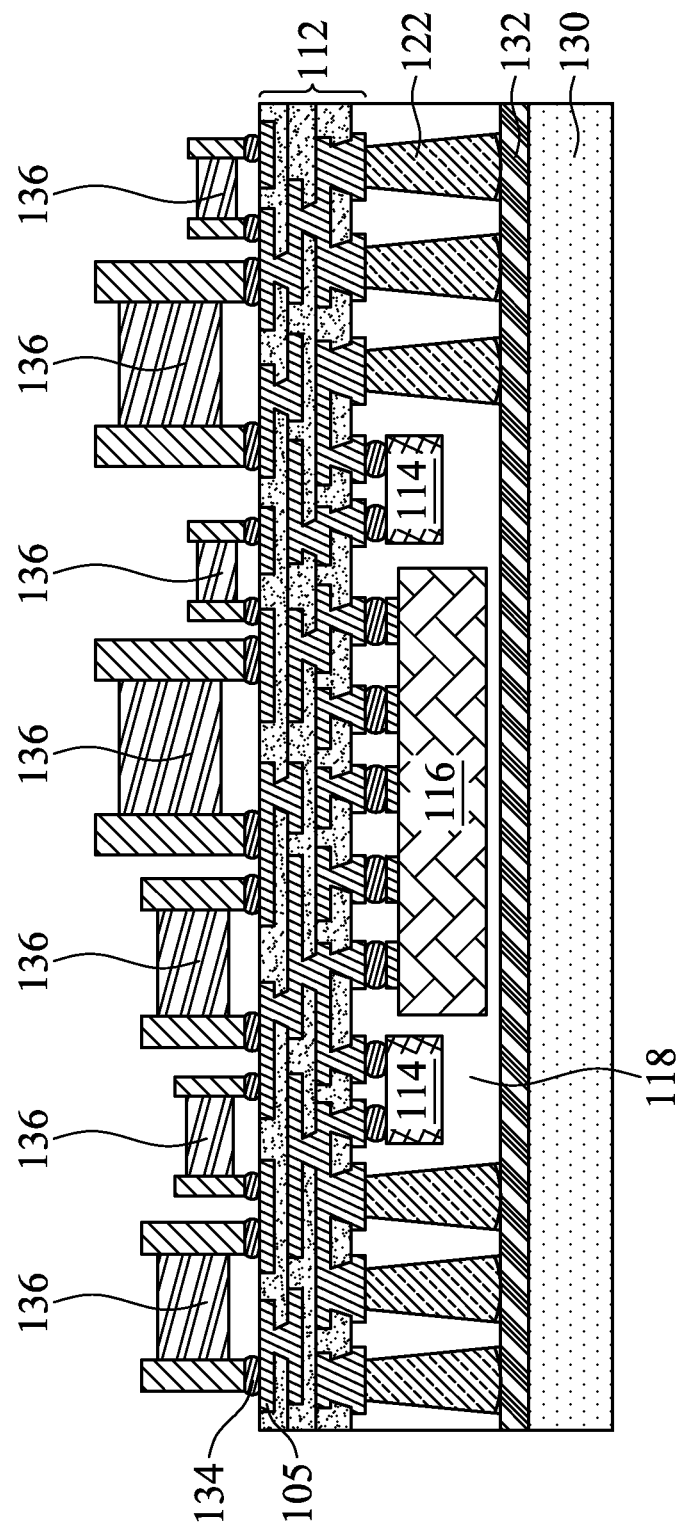

In FIG. 10, one or more integrated devices 136 are attached to the conductive connectors 134, in accordance with some embodiments. The integrated devices 136 are electrically connected to the redistribution structure 112 by the conductive connectors 134. The integrated devices 136 may be, for example, a semiconductor device, electronic component, or other device that includes one or more passive devices such as capacitors, resistors, inductors, and the like. In some embodiments, the integrated devices 136 may be IPDs, MLCCs, surface-mount devices (SMDs), or the like. The integrated devices 136 attached to the redistribution structure 112 may be similar devices or may be different types of devices, and may have similar dimensions or different dimensions. FIG. 10 illustrates the placement of seven integrated devices 136, but more or fewer of integrated devices 136 may be attached in other embodiments. The integrated devices 136 may be attached by, for example, sequentially dipping connectors (e.g., conductive bumps or pads) of the integrated devices 136 into flux, and then using a pick-and-place tool in order to physically align the connectors of the integrated devices 136 with corresponding conductive connectors 134. In some cases, a reflow process may be performed to bond the connectors of the integrated devices 136 to the conductive connectors 134.

In some embodiments, an optional underfill (not shown) is formed between each of the integrated devices 136 and the redistribution structure 112, surrounding the connectors of the integrated devices 136 and the corresponding conductive connectors 134. The optional underfill may reduce stress and protect the joints from damage resulting from the reflow process. The optional underfill may be formed, for example, by a capillary flow process after the integrated devices 136 are attached or by a suitable deposition method before the integrated devices 136 are attached. In some embodiments in which a flux is used to attach the integrated devices 136, the flux may act as the optional underfill.

Figure 11:
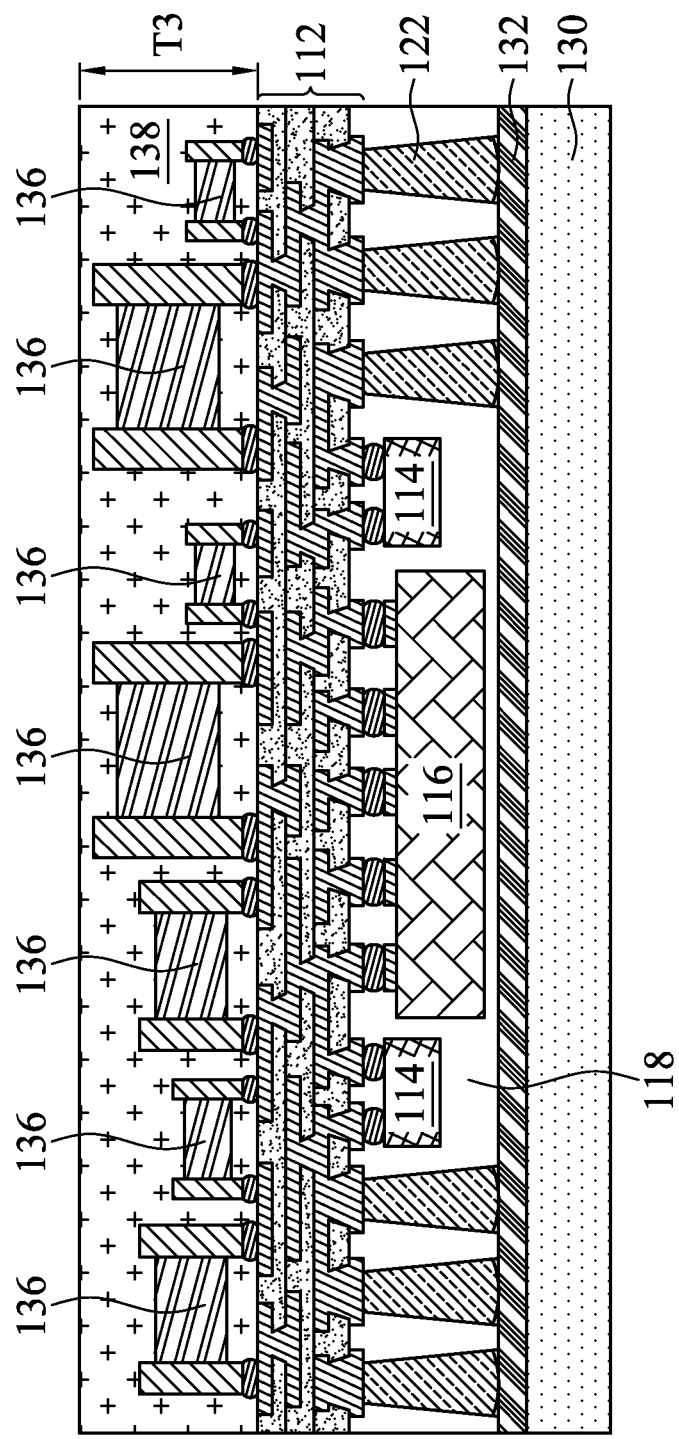

In FIG. 11, a second encapsulant 138 is formed over the redistribution structure 112 to encapsulate the integrated devices 136. The second encapsulant 138 may be a molding compound such as a resin, epoxy, polyimide, PPS, PEEK, PES, underfill, another material, the like, or a combination thereof. In some embodiments, the second encapsulant 138 may be applied using compression molding, transfer molding, or the like, although other application techniques are possible. In some embodiments, the second encapsulant 138 is cured. In some embodiments, the second encapsulant 138 is a material similar to that of the first encapsulant 118, and may be formed using a similar technique.

In some embodiments, the second encapsulant 138 has a coefficient of thermal expansion (CTE) in a range between about 10 ppm/K and about 80 ppm/K. However, the second encapsulant 138 may have any suitable CTE inside or outside of this example range. In some embodiments, the material of the second encapsulant 138 may be chosen to have a CTE that reduces or minimizes warpage of a package structure, such as package structure 150 shown in FIGS. 13A-C. For example, the material of the second encapsulant 138 may be chosen to have a CTE that is close to the CTE of one or more of the integrated devices 136. In this manner, the second encapsulant 138 has a proportional thermal expansion that is similar to that of the integrated devices 136, and the risk of cracking or warping may be reduced. In some cases, this can reduce the warping of the redistribution structure 112 or a package structure 150 (see FIGS. 13A-C). In some cases, having a structure on a first side of a redistribution structure that expands differently than the structure on the opposite side of the redistribution structure can cause warping, as the lateral stress on the first side may be different than the lateral stress on the opposite side. In this manner, having similar overall CTEs of the encapsulant and devices on both sides of the redistribution structure 112 can reduce warping. In some cases, the material of the second encapsulant 138 may be chosen to have a particular CTE based on the CTE of the material of the first encapsulant 118. For example, the material of the second encapsulant 138 may be chosen such that the overall CTE of the second encapsulant 138 and the integrated devices 136 is more similar to the overall CTE of the first encapsulant 118, the devices 114, and the semiconductor device 116. The material of the first encapsulant 118 may be chosen in a similar manner to more closely match the overall CTE of the second encapsulant 138 and the integrated devices 136.

In some embodiments, the second encapsulant 138 is planarized (e.g., using a CMP and/or grinding process), which may expose at least one integrated device 136. In some embodiments, the second encapsulant 138 may have a thickness T3 that is in the range of about 200 μm to about 700 μm, though other thicknesses are possible. In some cases, the thickness T3 may be based on a height of the integrated devices 136. In some embodiments, a thickness T2 of the first encapsulant 118 and a thickness T3 of the second encapsulant 138 may have a ratio T2:T3 that is between about 1:1 and about 1:8 though other ratios may be used. In some embodiments, the thickness T2 of the first encapsulant 118, the thickness T3 of the second encapsulant 138, or the thickness ratio T2:T3 may be controlled to reduce warping of a package structure, such as package structure 150 shown in FIGS. 13A-C. In some cases, the thicknesses T2 or T3, or the ratio T2:T3 may be chosen based on the CTEs of the first encapsulant 118 and/or the second encapsulant 138 to reduce warping in this manner. For example, the encapsulant (e.g., 118 or 138) that has the greatest CTE may be formed thinner than the other encapsulant to reduce warping effects due to the greater thermal expansion. As another example, the thicknesses of the first encapsulant 118 and the second encapsulant 138 may be chosen such that the absolute expansions of the first encapsulant 118 and the second encapsulant 138 are more similar at a certain temperature or in a certain range of temperatures. In some cases, the thickness or material of the first encapsulant 118 and/or the second encapsulant 138 may be chosen based on characteristics (e.g., size, number, composition) of the respectively encapsulated components (e.g., the integrated devices 114, the semiconductor device 116, or the integrated devices 136). For example, the materials of the first encapsulant 118 and/or the second encapsulant 138 may be chosen to match or counteract thermal expansion of the respectively encapsulated components.

Figure 12:
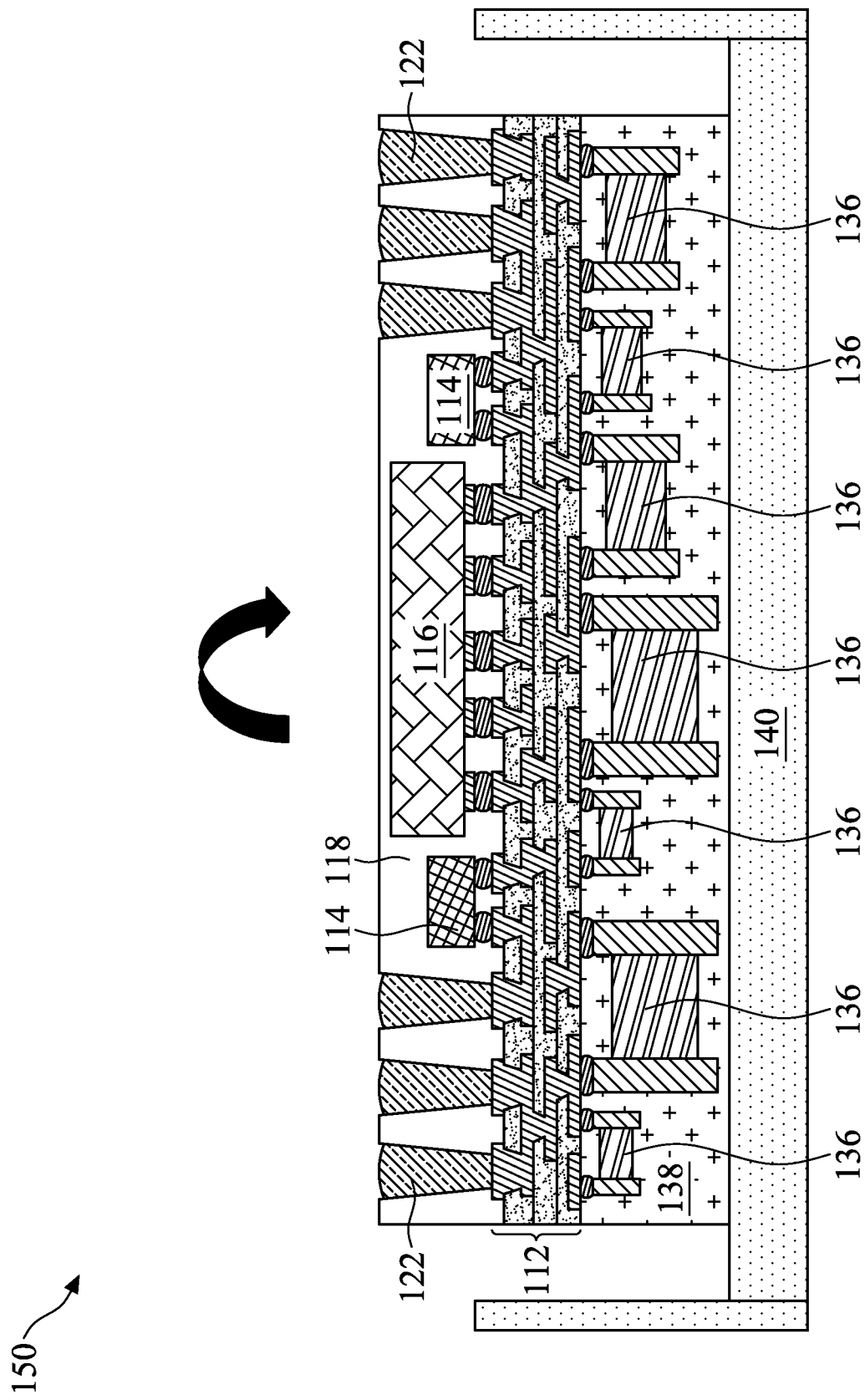

In FIG. 12, a carrier substrate de-bonding is performed to detach (or "de-bond") the second carrier substrate 130 from the structure, e.g., the first encapsulant 118. In accordance with some embodiments, the de-bonding includes projecting a light such as a laser light or an UV light on the release layer 132 so that the release layer 132 decomposes under the heat of the light and the second carrier substrate 130 can be removed. The structure is then flipped over and placed on a carrier 140, which may be, for example, a tape, a frame, or the like. A cleaning process (e.g., a wet clean) may be performed to remove residue, such as residue from the release layer 132.

Figure 13A:
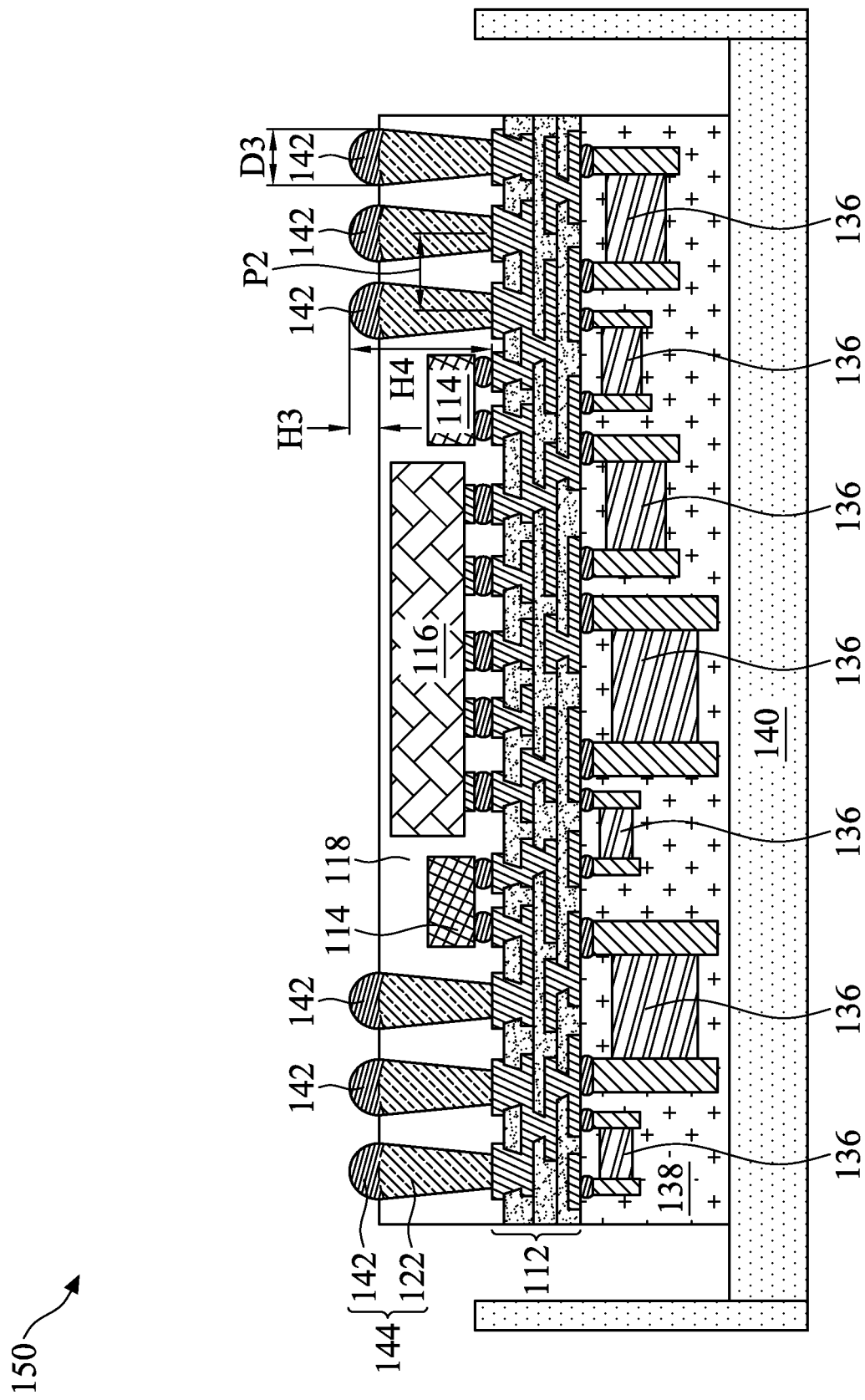
Figure 13B:
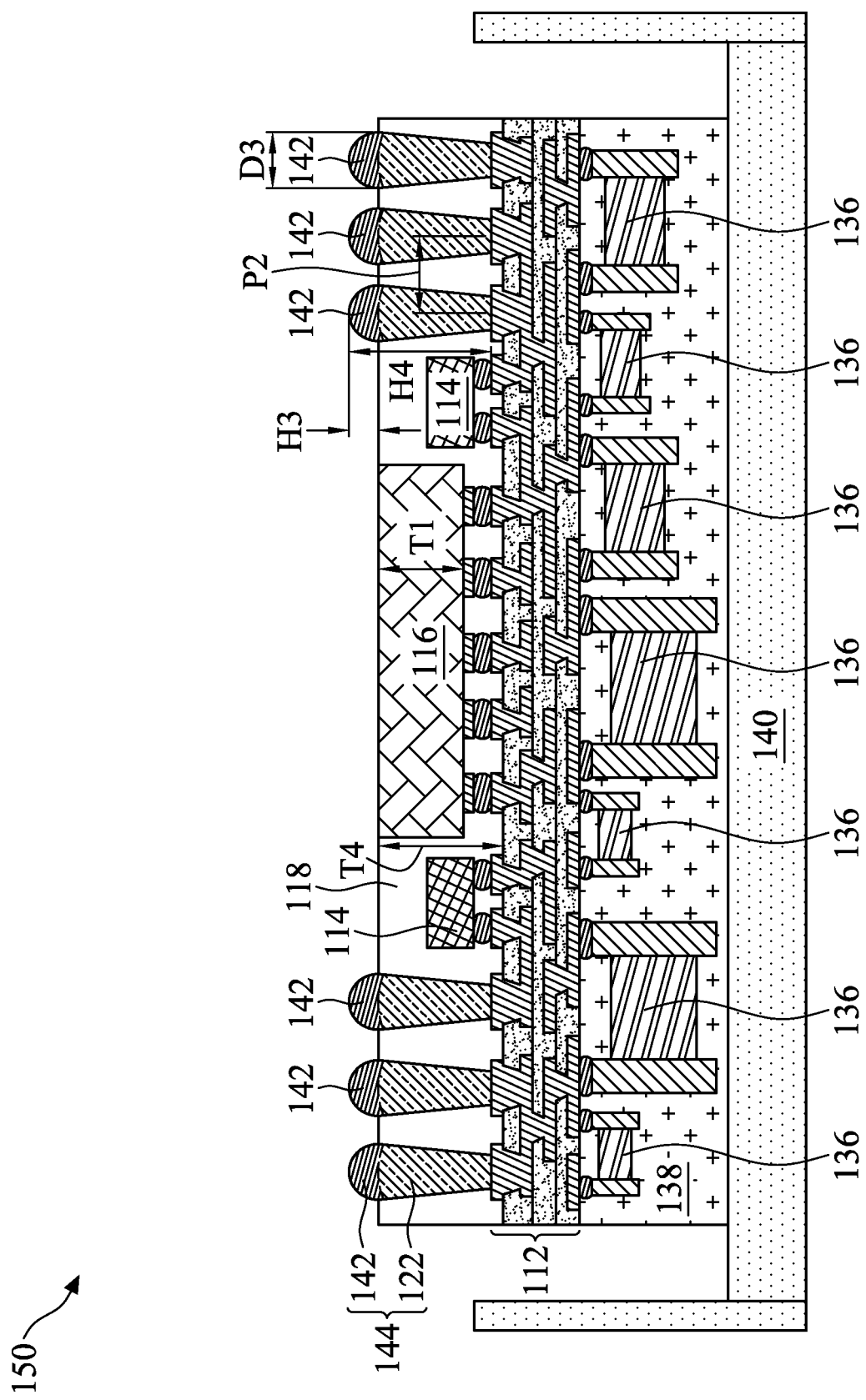
Figure 13C:
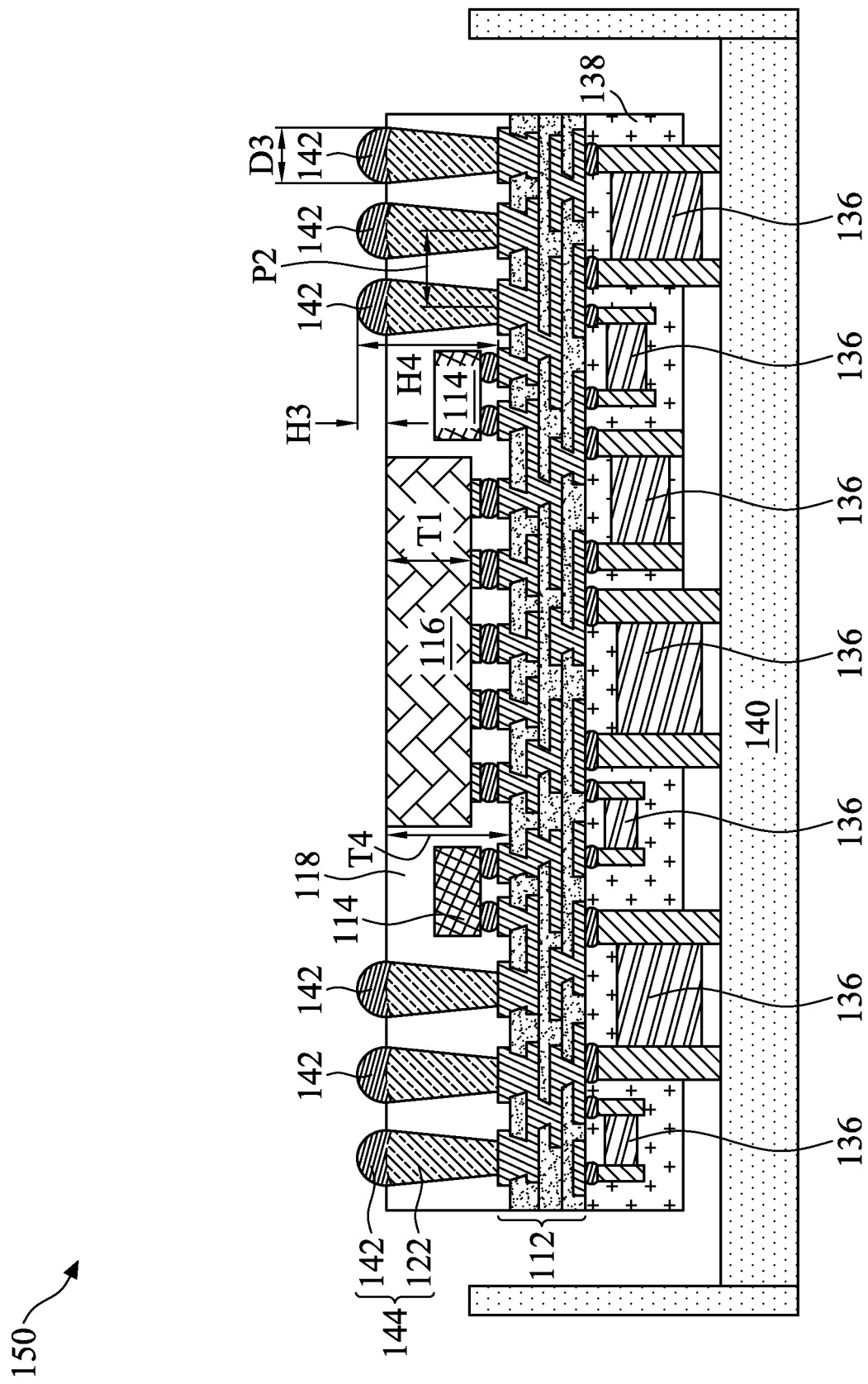

In FIGS. 13A-C, solder material 142 is formed on the conductive material 122, forming a package structure 150, in accordance with some embodiments. The package structure 150 shown in FIG. 13B is similar to the package structure 150 shown in FIG. 13A, except that the semiconductor device 116 is covered by the first encapsulant 118 in FIG. 13A and the semiconductor device 116 is exposed in FIG. 13B. The package structure 150 shown in FIG. 13C is similar to the package structure 150 shown in FIG. 13A, except that the semiconductor device 116 is exposed and one or more of the integrated devices 136 are exposed in FIG. 13C. In some cases, leaving the semiconductor device 116 and/or the integrated devices 136 covered can provide additional protection for the semiconductor device 116 and/or the integrated devices 136.

In some embodiments, the semiconductor device 116 of FIG. 13B or 13C may be exposed by performing a planarization process on the first encapsulant 118 after encapsulating the semiconductor device 116 (see FIG. 5). The planarization process, which may include a CMP and/or a grinding process, may thin the first encapsulant 118 until the top surface of the semiconductor device 116 is exposed. The planarization process may also thin the semiconductor device 116, in some embodiments. After planarization, the top surface of the semiconductor device 116 may be below the surface of the first encapsulant 118, about level with the surface of the first encapsulant 118, or protrude above the surface of the first encapsulant 118. In some embodiments in which the semiconductor device 116 protrudes from the first encapsulant 118, the first encapsulant 118 adjacent the exposed semiconductor device 116 may have a thickness T4 that is between about 80% and about 100% of the thickness T1 of the semiconductor device 116. In some cases, exposing the semiconductor device 116 as shown in FIGS. 13B-C can allow for improved heat dissipation, a thinner package structure 150, or allow less confined thermal expansion of the semiconductor device 116, which can reduce warping. Exposing the semiconductor device 116 can also allow for subsequent processes to be performed on the top surface of the semiconductor device 116, such as marking the top surface or attaching other components to the top surface.

FIG. 13C shows the exposed integrated devices 136 as protruding from the second encapsulant 138, but in other embodiments the exposed surfaces of the integrated devices 136 are coplanar with the second encapsulant 114. In some embodiments, one or more of the integrated devices 136 may be exposed by initially depositing the second encapsulant 138 to a thickness that is less than the one or more of the integrated devices 136. In some embodiments, the integrated devices 136 of FIG. 13C may be exposed by performing a planarization process and/or an etching process on the second encapsulant 138 after encapsulating the integrated devices 136. The etching process may include, for example, a wet etching process and/or a dry etching process. In some cases, exposing integrated devices 136 as shown in FIG. 13C can allow for improved heat dissipation, a thinner package structure 150, or allow less confined thermal expansion of the integrated devices 136, which can reduce warping. In some embodiments, an integrated device 136 may include a sensor (e.g., a light sensor), and exposing the integrated device 136 exposes the sensor so that it may sense the environment as desired.

Referring to FIGS. 13A-C, the solder material 142 and the conductive material 122 together form interconnects 144 that extend through the first encapsulant 118 and are electrically connected to the redistribution structure 112 of the package structure 150. The interconnects 144 may be used, for example, to connect external components or structures to the package structure 150. In the embodiments shown in FIGS. 13A-C, the package structure 150 includes a first encapsulant 118 on a first side of a redistribution structure 112, interconnects 144 extending through the first encapsulant 118 to the first side of the redistribution structure 112, and a second encapsulant 138 on a second side of the redistribution structure 112. In some cases, the package structure 150 may be considered, for example, a System-in-Package (SiP) structure, a fan-out package, or the like.

The solder material 142 is formed on the conductive material 122 to form the interconnects 144. According to some embodiments, the solder material 142 is formed by initially forming a layer of pre-solder paste or solder on the conductive material 122. However, any suitable process (e.g., evaporation, electroplating, printing, solder transfer, ball placement, or the like) may be used to form the pre-solder paste or solder on the conductive material 122. In some embodiments, the solder material 142 may be micro bumps. However, the solder material 142 may also be ball grid array (BGA) connectors, solder balls, metal pillars, controlled collapse chip connection (C4) bumps, electroless nickel-electroless palladium-immersion gold technique (ENEPIG) formed bumps, or the like. The solder material 142 may include a conductive material such as solder, copper, aluminum, gold, nickel, silver, palladium, tin, the like, or a combination thereof. The solder material 142 and the conductive material 122 may have the same composition or may have different compositions. In some embodiments, a reflow process may be performed after forming the solder material 142. In other embodiments, solder material 142 is not used.

In some embodiments, the solder material 142 may protrude a height H3 above a top surface of the first encapsulant 118 that is in a range between about 50 µm and about 100 µm, though other heights are possible. The interconnects 144 may have a total height H4 that is in a range between about 100 µm and about 1600 µm, though other heights are possible. In some cases, the solder material 142 may extend over a top surface of the first encapsulant 118 and/or below a top surface of the first encapsulant 118. In some embodiments, the solder material 142 may have a width D3 that is in a range between about 50 µm and about 400 µm, though other widths are possible. The width D3 may be greater than, about the same, or less than the top width D2 of the openings 120 (see FIG. 6). The interconnects 144 may have an aspect ratio (H4:D3) that is in a range between about 1:8 and about 1:10, though other aspect ratios are possible. In some cases, the techniques described herein allow for interconnects 144 of a package structure to be formed having a smaller pitch without increased risk of bridging. This can allow for a greater density of interconnects 144 and thus can allow for greater flexibility of design, a greater number of interconnects, smaller size, or improved performance of a package structure. In some embodiments, the interconnects 144 may be formed having a pitch P2 that is in a range between about 80 µm and about 1000 µm, though other pitches are possible. The pitch P2 may be about the same as the pitch P1 of the openings 120 (see FIG. 6).

In some embodiments, multiple package structures 150 may be formed on the same carrier (e.g., carriers 102, 130, and/or 140) and then singulated to form individual package structures 150. FIGS. 14A and 14B illustrate an example singulation process, in accordance with some embodiments. FIG. 14A illustrates package structures 150A and 150B formed together on a single carrier 140. In FIG. 14B, a singulation process is performed by sawing along scribe line regions, e.g., between the package structure 150A and the package structure 150B. The sawing singulates the package structure 150A from the package structure 150B. In some embodiments, the singulation process is performed after forming the interconnects 144.

FIGS. 15A, 15B, and 15C show cross-sectional views of a package structure 150, in accordance with some embodiments. FIG. 15A shows a cross-sectional view of a package structure 150, similar to FIG. 14. FIG. 15B shows a schematic cross-sectional view through the cross-section labeled "B-B" in FIG. 15A, and FIG. 15C shows a schematic cross-sectional view through the cross-section labeled "C-C" in FIG. 15A. As shown in FIGS. 15A-C, the package structure 150 as described herein may be an asymmetric dual-sided molded package on a multi-layered redistribution structure. As shown in FIG. 15B, a package structure 150 may include multiple integrated devices 114 (such as IPDs or other devices described previously), multiple semiconductor devices 116 (such as SoC devices or other devices described previously), and multiple interconnects 144 connected to a first side of the redistribution structure 112 and surrounded by a first encapsulant 118. In this manner, the interconnects 144 may function as through-mold vias (TMVs) in some cases. The techniques described herein allow the formation of interconnects 144 having a finer pitch without increased risk of bridging or other defects. As shown in FIG. 15C, a package structure 150 may include multiple integrated devices 136 (such as SMDs or other devices described previously) connected to a second side of the redistribution structure 112 and surrounded by a second encapsulant 138. In some embodiments, the type(s) of components attached to the first side of the redistribution structure 112 are different from the type(s) of components attached to the second side of the redistribution structure 112. The package structure 150 and associated cross-sectional views shown in FIGS. 15A-C is intended to be an illustrative example, and the package structure 150 shown in FIGS. 15A-C or other package structures described herein may have other layouts, other components or devices, other arrangements of components or devices, components or devices having other dimensions, other pitches or arrangements of interconnects, or the like, and all such variations are considered within the scope of the present disclosure.

Figure 16:
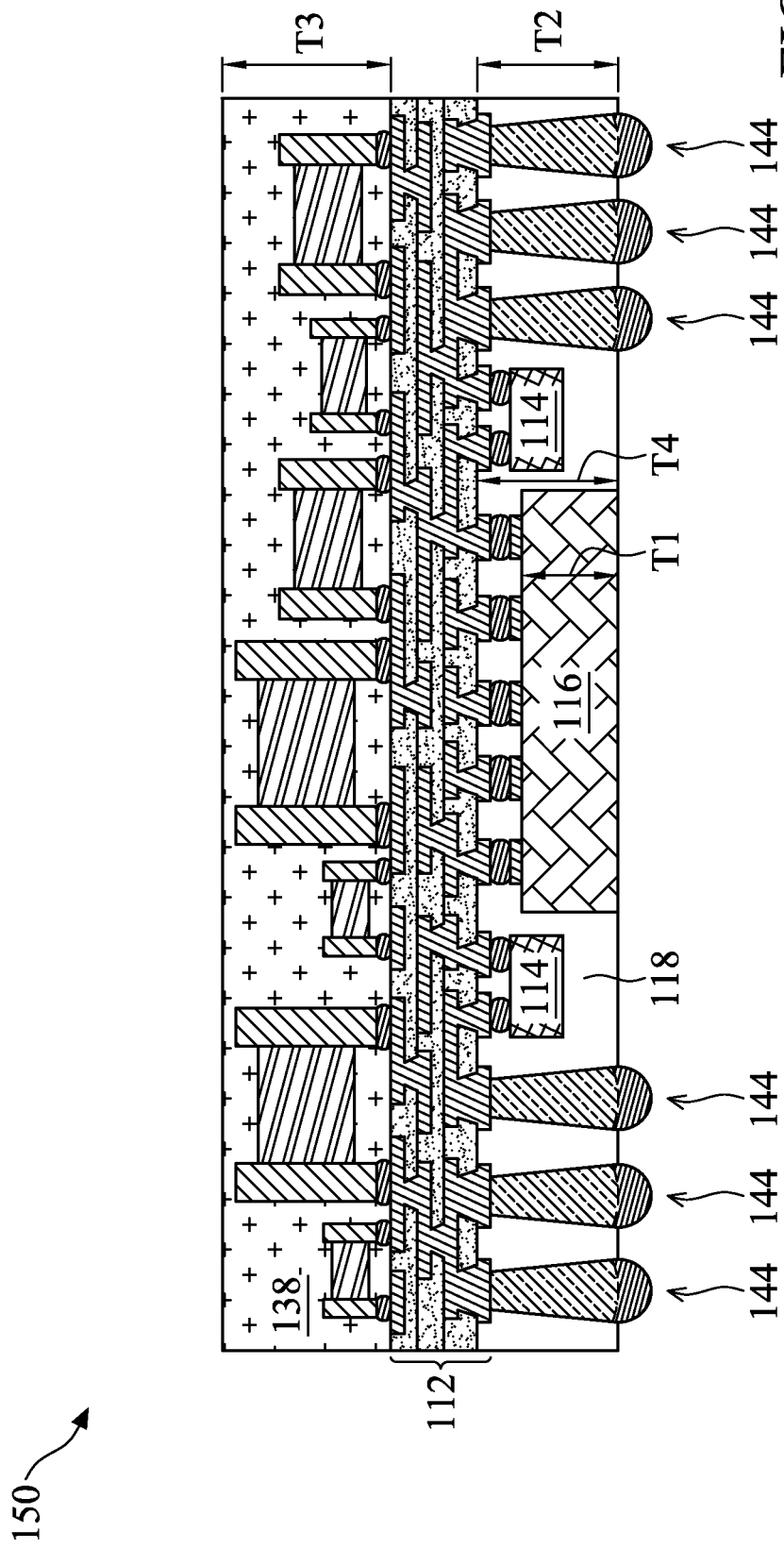

Turning to FIG. 16, each singulated package structure 150 may be attached to an external component, in accordance with some embodiments. FIG. 16 shows an example in which a package structure 150 is attached to a package substrate 300. Other external components may include a substrate, organic core, package, printed circuit board (PCB), or the like. In some embodiments, the package structure 150 is placed on the external component such that the interconnects 144 of the package structure 150 are aligned with corresponding conductive features (e.g., bond pads) of the external component, and then the interconnects 144 are reflowed to attach the package structure 150 to the external component. The interconnects 144 electrically and/or physically couple the package structure 150, including metallization layers in the redistribution structure 112, to the external component.

The package substrate 300 includes a substrate core 302 and bond pads 304 over the substrate core 302. The substrate core 302 may be made of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate core 302 may be a SOI substrate. Generally, an SOI substrate includes a layer of a semiconductor material such as epitaxial silicon, germanium, silicon germanium, SOI, SGOI, or combinations thereof. The substrate core 302 is, in one alternative embodiment, based on an insulating core such as a fiberglass reinforced resin core. One example core material is fiberglass resin such as FR4. Alternatives for the core material include bismaleimide-triazine BT resin, or alternatively, other PCB materials or films. Build up films such as ABF or other laminates may be used for substrate core 302. The substrate core 302 may include active and passive devices (not shown). A wide variety of devices such as transistors, capacitors, resistors, combinations of these, and the like may be used to generate the structural and functional requirements of the design for the device stack. The devices may be formed using any suitable methods.

The substrate core 302 may also include metallization layers and vias (not shown), with the bond pads 304 being physically and/or electrically coupled to the metallization layers and vias. The metallization layers may be formed over the active and passive devices and are designed to connect the various devices to form functional circuitry. The metallization layers may be formed of alternating layers of dielectric (e.g., low-k dielectric material) and conductive material (e.g., copper) with vias interconnecting the layers of conductive material and may be formed through any suitable process (such as deposition, damascene, dual damascene, or the like). In some embodiments, the substrate core 302 is substantially free of active and passive devices.

In some embodiments, the interconnects 144 are reflowed to attach the package structure 150 to the bond pads 304. The interconnects 144 electrically and/or physically couple the package substrate 300, including metallization layers in the substrate core 302, to the package structure 150. The interconnects 144 may have an epoxy flux (not shown) formed thereon before they are reflowed with at least some of the epoxy portion of the epoxy flux remaining after the package structure 150 is attached to the package substrate 300. This remaining epoxy portion may act as an underfill to reduce stress and protect the joints resulting from the reflowing the interconnects 144. In some embodiments, an underfill 308 may be formed between the package structure 150 and the package substrate 300 and surrounding the interconnects 144. The underfill 308 may be formed by a capillary flow process after the package structure 150 is attached, or it may be formed by a suitable deposition method before the package structure 150 is attached.

FIGS. 17 through 26A-B illustrate cross-sectional views of intermediate steps in the formation of a package structure 250 (see FIG. 25), in accordance with some embodiments. The package structure 250 is similar to the package structure 150 except the conductive material (e.g., first conductive material 222) of the interconnects (e.g., interconnects 244) is formed prior to encapsulation by the first encapsulant 118. Some features and steps of forming the package structure 250 may be similar to features or steps of forming the package structure 150 as described in FIGS. 1 through 16, and as such, some of these similar details may be omitted in the following description.

Figure 17:
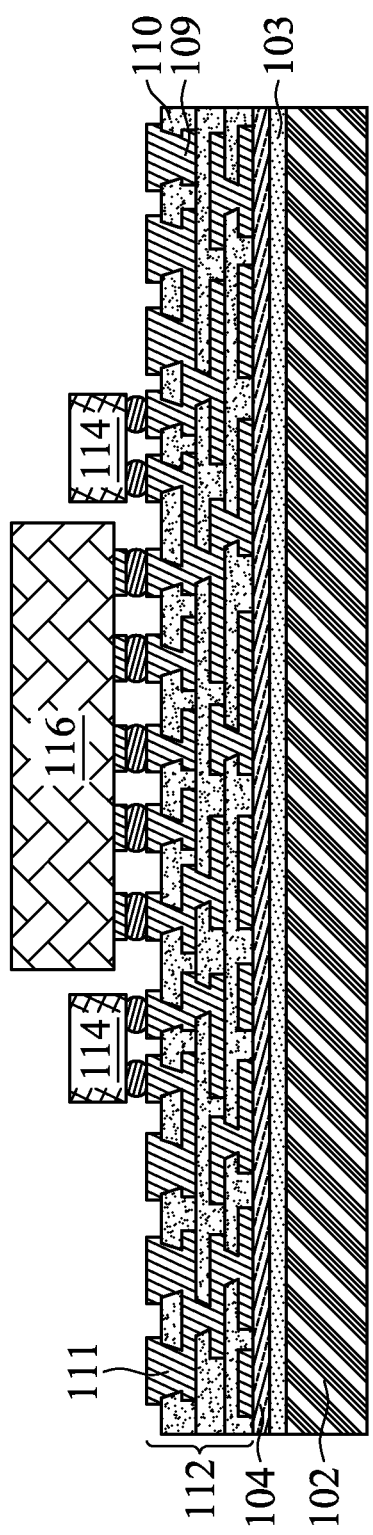
FIGS. 17, 18, 19, 20, 21A, 21B, 22, 23, 24, 25, 26A, and 26B illustrate cross-sectional views of intermediate steps in the formation of a package structure, in accordance with some embodiments.

Turning to FIG. 17, a redistribution structure 112 having attached integrated devices 114 and a semiconductor device 116 is shown, in accordance with some embodiments. The structure shown in FIG. 17 may be similar to the structure shown previously in FIG. 4 and may be formed in a similar manner as described for FIGS. 1-4.

Figure 18:
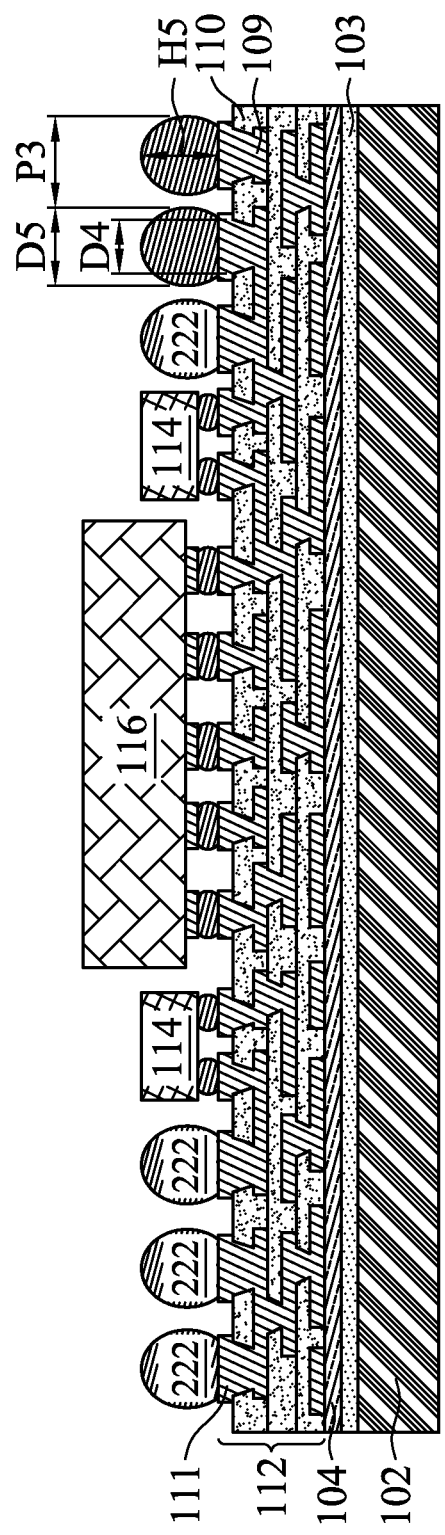

In FIG. 18, first conductive material 222 is formed on the redistribution structure 112, in accordance with some embodiments. The first conductive material 222 makes physical and electrical contact with the topmost metallization pattern (e.g., metallization pattern 111) or UBMs (if present) of the redistribution structure 112. According to some embodiments, the first conductive material 222 is formed by initially forming a layer of pre-solder paste or solder on the redistribution structure 112. However, any suitable process (e.g., evaporation, electroplating, printing, solder transfer, ball placement, or the like) may be used to form the pre-solder paste or solder on the redistribution structure 112. In some embodiments, the first conductive material 222 may be micro bumps. However, the first conductive material 222 may also be ball grid array (BGA) connectors, solder balls, metal pillars, controlled collapse chip connection (C4) bumps, electroless nickel-electroless palladium-immersion gold technique (ENEPIG) formed bumps, or the like. The first conductive material 222 may include a conductive material such as solder, copper, aluminum, gold, nickel, silver, palladium, tin, the like, or a combination thereof. In some embodiments, a reflow process may be performed after forming the first conductive material 222.

In some embodiments, the first conductive material 222 may have a height H5 that is in a range between about 80 µm and about 250 µm, though other heights are possible. In some embodiments, the first conductive material 222 may have a bottom width D4 that is in a range between about 100 µm and about 450 µm, though other widths are possible. The first conductive material 222 may have a largest width D5 that is in a range between about 120 µm and about 600 µm, though other widths are possible. In some embodiments, the bottom width D4 may be about the same as the largest width D5, or the bottom width D4 may be smaller than the largest width D5. In some embodiments, the ratio of D4:D5 may be between about 0.75:1 and about 0.85:1, though other ratios are possible. In some embodiments, the first conductive material 222 may be formed having a pitch P3 that is in a range between about 150 µm and about 700 µm, though other pitches are possible.

Figure 19:
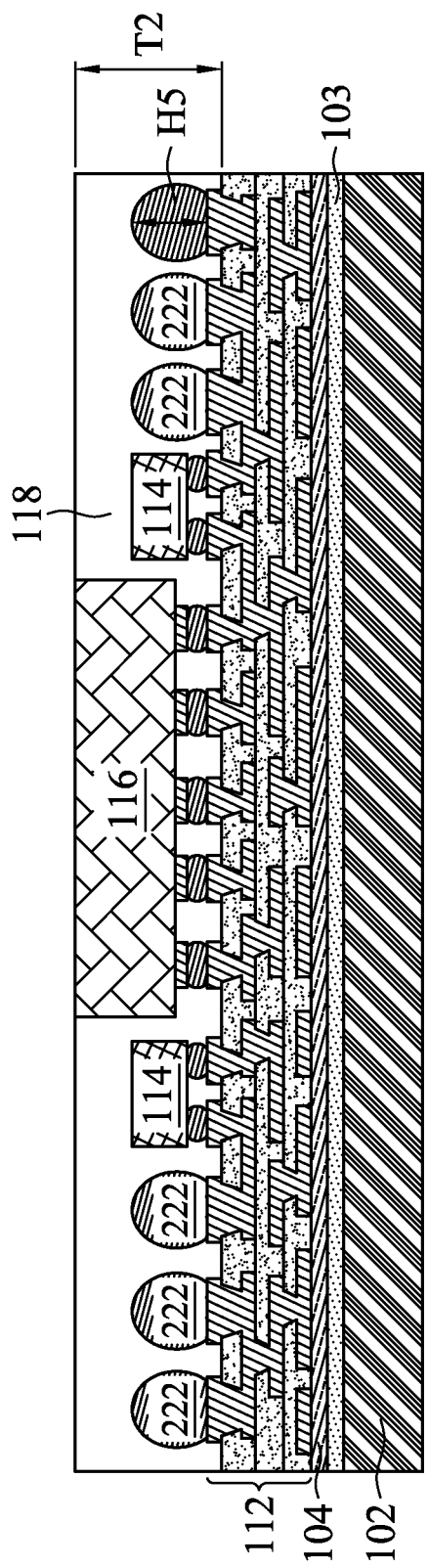

In FIG. 19, a first encapsulant 118 is formed over the redistribution structure 112 to encapsulate the first conductive material 222, the integrated devices 114, and the semiconductor device 116, in accordance with some embodiments. The first encapsulant 118 may be a material similar to that described previously for FIG. 5, and may be formed in a similar manner. In some embodiments, the first encapsulant 118 is planarized (e.g., using a CMP and/or grinding process), which may expose at least one semiconductor device 116. FIGS. 19 through 25 illustrate an embodiment in which the semiconductor device 116 is exposed, but in other embodiments the semiconductor device 116 may remain covered by the first encapsulant 118. In some embodiments, the ratio of the height H5 of the first conductive material 222 to the thickness T2 of the first encapsulant 118 (e.g., the ratio H5:T2) may be between about 0.5:1 and about 0.7:1, though other ratios are possible. In some embodiments, the ratio of the bottom width D4 of the first conductive material 222 to the thickness T2 of the first encapsulant 118 (e.g., the ratio D4:T2) may be between about 0.4:1 and about 0.56:1. In some cases, forming the first conductive material 222 having a smaller size (e.g., smaller height H5, smaller bottom width D4, and/or smaller largest width D5) may allow the pitch P3 of the first conductive material 222 to be smaller, and thus allow the pitch P5 of the interconnects 244 (see FIG. 25) to be smaller.

Figure 20:
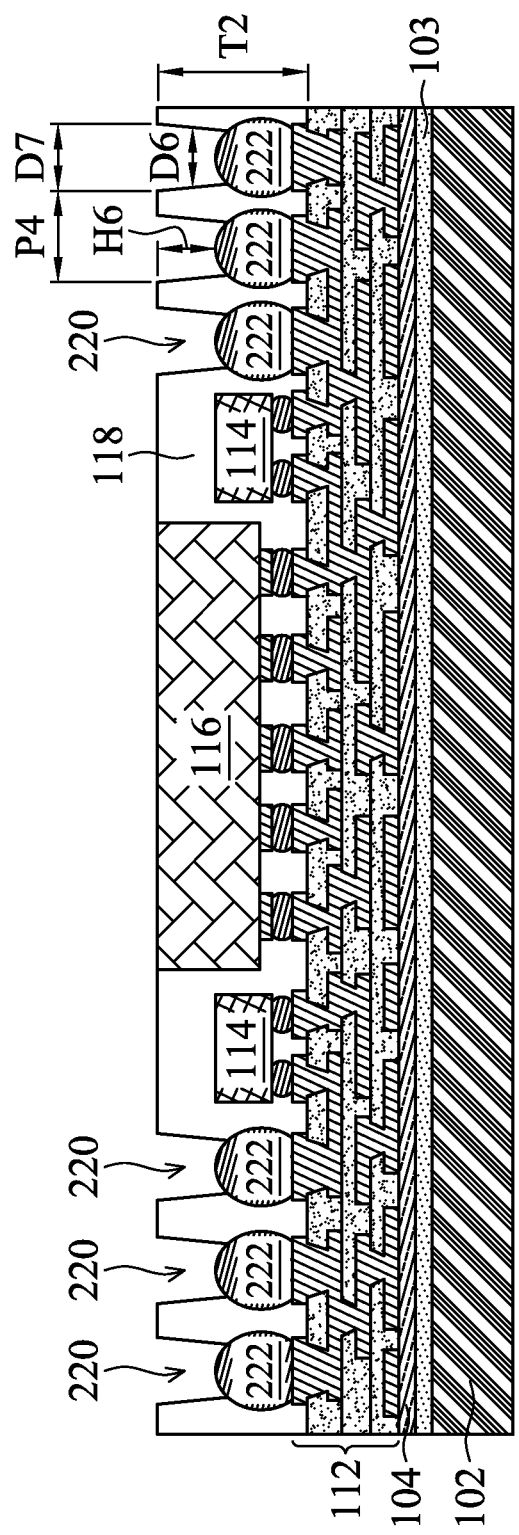

In FIG. 20, openings 220 are formed in the first encapsulant 118 to expose the first conductive material 222, in accordance with some embodiments. In some embodiments, the openings 120 may be formed using a laser drilling process, which may be similar to the laser drilling process described previously for FIG. 6. The laser drilling process may include an energy in a range between about 0.1 mJ and about 0.2 mJ, in some embodiments. Other energies may be used. In some embodiments, a cleaning process (e.g., a wet clean) may be performed after the laser drilling process to remove residue. Other techniques may be used for forming the openings 220.

The openings 220 may have substantially vertical profile or may have a tapered profile, as shown in FIG. 20. For example, in some embodiments, the openings 220 may have a bottom width D6 that is about the same as the top width D7, or the bottom width D6 may be smaller than the top width D7. In some embodiments, the openings 220 may have a bottom width D6 that is in a range between about 50 µm and about 500 µm and a top width D7 that is in a range between about 55 µm and about 550 µm, though other widths are possible. In some embodiments, the ratio of D6:D7 may be between about 1:1.1 and about 1:1.3, though other ratios are possible. In some cases, forming the openings 220 with a vertical or tapered profile may allow for improved filling of the openings 220 by second conductive material 224 (see FIG. 21). In some embodiments, the bottom width D7 is less than or about equal to the largest width D5 of the first conductive material 222. In some cases, a larger bottom width D7 can expose more surface area of the first conductive material 222 and reduce resistance between the conductive material and the subsequently formed second conductive material 224 (see FIGS. 21A-B).

In some embodiments, the openings 220 may have a height H6 that is in a range between about 50 μm and about 500 μm, though other heights are possible. The openings 220 may have an aspect ratio D6:H6 that is in a range between about 0.4:1 and about 1:1, though other aspect ratios are possible. In some embodiments, the ratio of the height H6 of the openings 220 to the thickness T2 of the first encapsulant 118 (e.g., the ratio H6:T2) may be between about 0.5:1 and about 0.7:1, though other ratios are possible. In some cases, forming the openings 220 with a smaller top width D7 or a taller aspect ratio D6:H6 (e.g., having a relatively larger H6) can allow for the openings 220 to be formed having a smaller pitch P4. In some embodiments, the openings 220 may be formed having a pitch P4 that is in a range between about 150 μm and about 500 μm, though other pitches are possible. In this manner, the subsequently formed interconnects 244 (see FIG. 25) may be formed having a smaller width or a smaller pitch, and thus the techniques herein can allow for a greater density of interconnects 244 to be formed. Other widths, dimensions, aspect ratios, or profiles are possible.

Figure 21A:
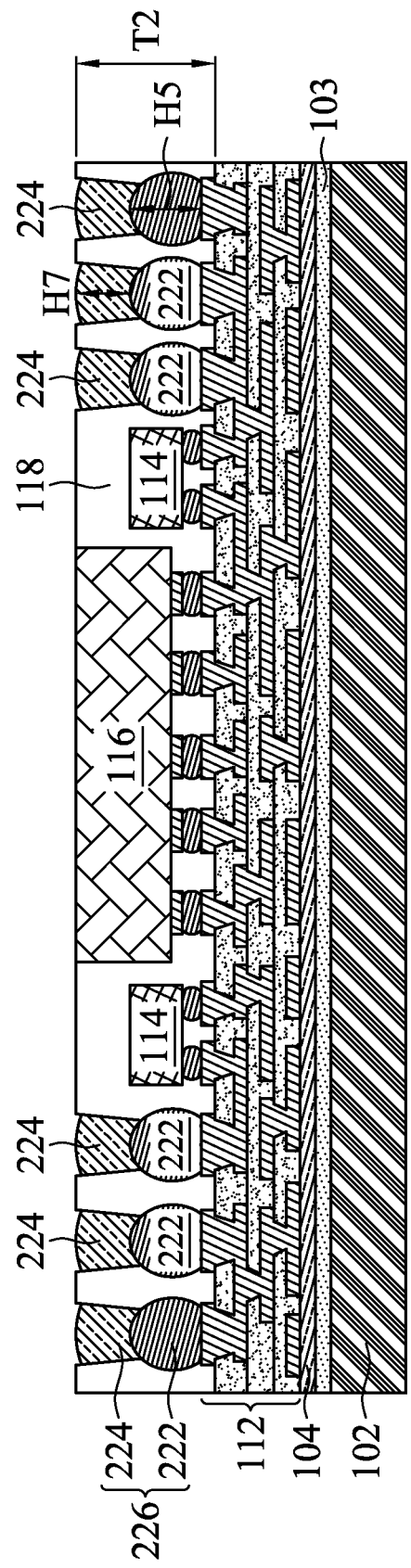
Figure 21B:
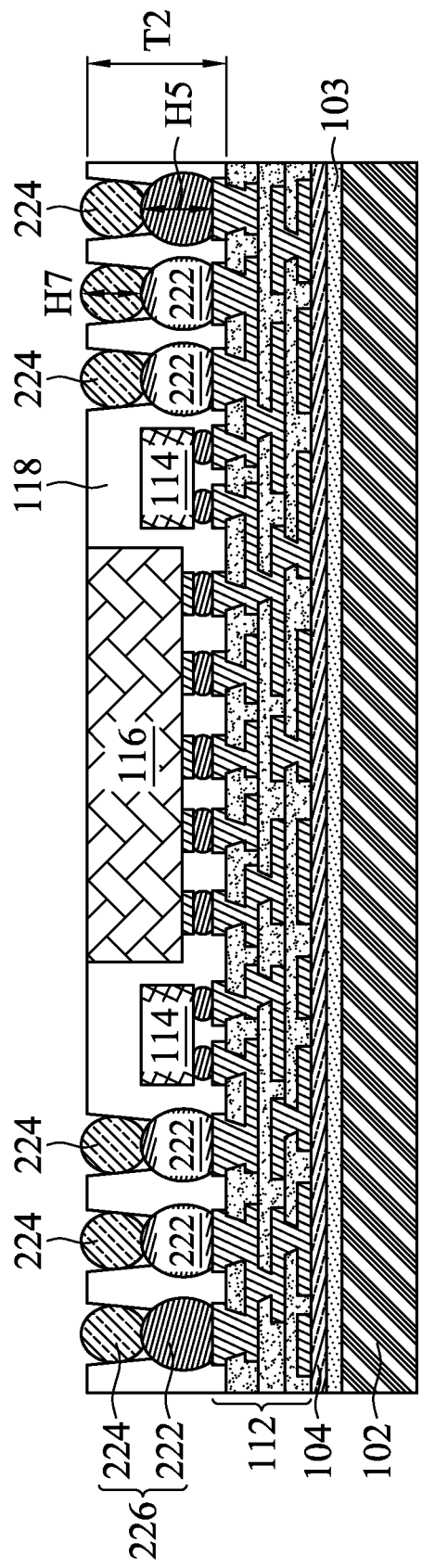

Turning to FIGS. 21A and 21B, a second conductive material 224 is formed in the openings 220, in accordance with some embodiments. FIG. 21A illustrates an embodiment in which the second conductive material 224 comprises a conductive paste, and FIG. 21B illustrates an embodiment in which the second conductive material 224 comprises solder balls. Subsequent figures illustrate structures formed from the embodiment of FIG. 21A, though similar structures may be formed from the embodiment of FIG. 21B or other embodiments not specifically shown. The second conductive material 224 in the openings 220 makes physical and electrical contact with the first conductive material 222. As such, the first conductive material 222 and the second conductive material 224 together form a single interconnect stack 226 that extends partially or fully through the first encapsulant 118 to connect to the redistribution structure 112. In some cases, the interconnect stacks 226 may be considered through-molding vias (TMVs).

A top surface of the second conductive material 224 may be below a top surface of the first encapsulant 118, may be about level with a top surface of the first encapsulant 118, or may protrude above a top surface of the first encapsulant 118. For example, a top surface of the second conductive material 224 may be below a top surface of the first encapsulant 118 a distance in a range between about 30 μm and about 50 μm, or a top surface of the second conductive material 224 may be above a top surface of the first encapsulant 118 a distance in a range between about 30 μm and about 50 μm. Other distances are possible.

In some embodiments, the second conductive material 224 may have a height H7 that is in a range between about 50 μm and about 300 μm, though other heights are possible. In this manner, the total height of the interconnect stacks 226 may be about H5+H7. In some embodiments, the ratio of the height H7 of the second conductive material 224 to the height H5 of the first conductive material 222 (e.g., the ratio H7:H5) may be between about 0.7:0.3 and about 0.5:0.5, though other ratios are possible. In some embodiments, the ratio of the height H7 of the second conductive material 224 to the thickness T2 of the first encapsulant 118 (e.g., the ratio H7:T2) may be between about 0.5:1 and about 0.7:1, though other ratios are possible. In some embodiments, the ratio of the mass of a second conductive material 224 to the mass of the first conductive material 222 may be between about 1:1 and about 1:1.5, though other ratios are possible.

FIG. 21A illustrates an embodiment in which the second conductive material 224 comprises a conductive paste such as solder paste, silver paste or adhesive, the like, or combinations thereof. The second conductive material 224 may be deposited using, for example, a suitable dispensing process or printing process. A reflow may be performed after depositing the second conductive material 224. The second conductive material 224 may be a similar material as the conductive material 122 described previously, or may be different material. The top surface of the second conductive material 224 may be concave, substantially flat, convex, or have another shape.

FIG. 21B illustrates an embodiment in which the second conductive material 224 comprises solder balls or the like, such as solder bumps, micro bumps, ball grid array (BGA) connectors, metal pillars, controlled collapse chip connection (C4) bumps, electroless nickel-electroless palladium-immersion gold technique (ENEPIG) formed bumps, or the like. The first conductive material 222 may include a conductive material such as solder, copper, aluminum, gold, nickel, silver, palladium, tin, the like, or a combination thereof. In some embodiments, a reflow process may be performed after forming the first conductive material 222.

Figure 22:
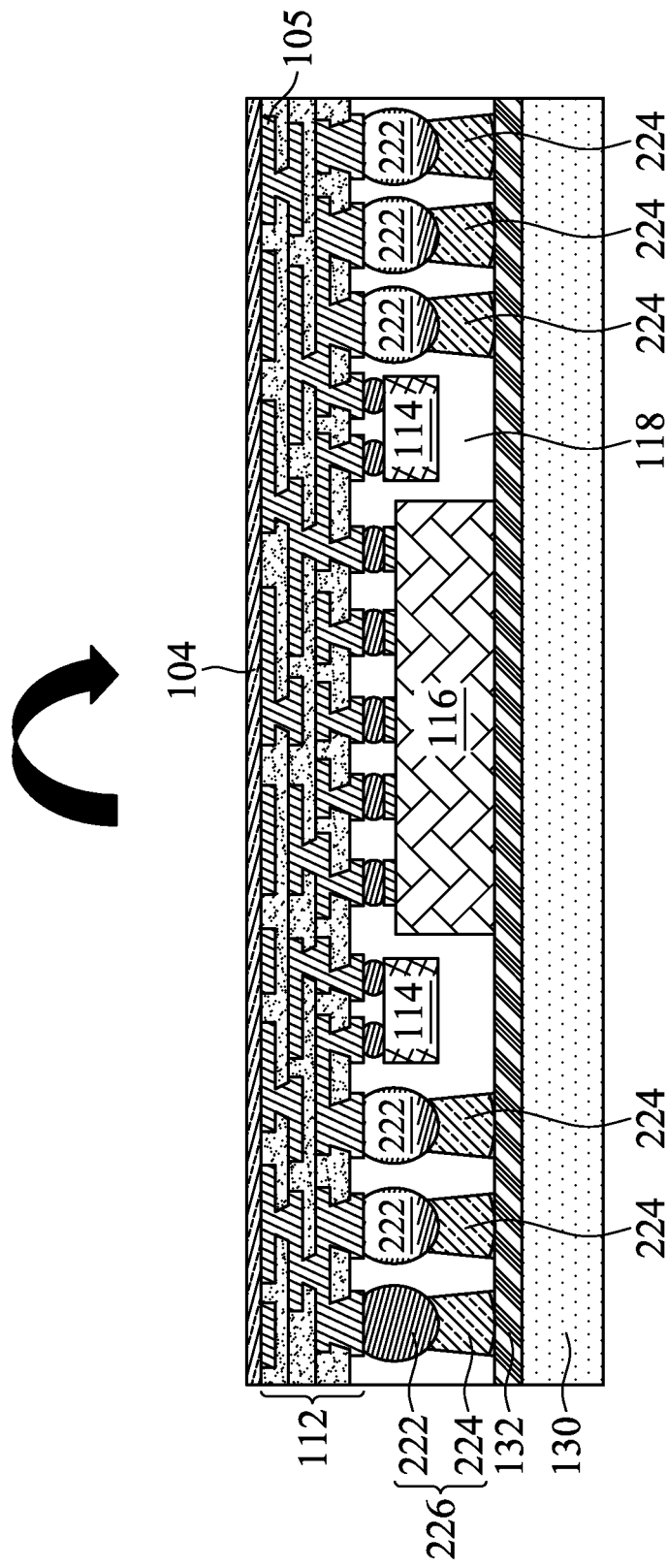

In FIG. 22, a carrier substrate de-bonding is performed to detach (or "de-bond") the first carrier substrate 102 from the redistribution structure, in accordance with some embodiments. The structure may then flipped be over and attached to a second carrier substrate 130. A release layer 132 may be formed on the second carrier substrate 130 to facilitate attachment of the structure to the second carrier substrate 130. The detaching of the first carrier substrate 102 and the attaching to the second carrier substrate 130 may be similar to the steps described previously for FIG. 8.

Figure 23:
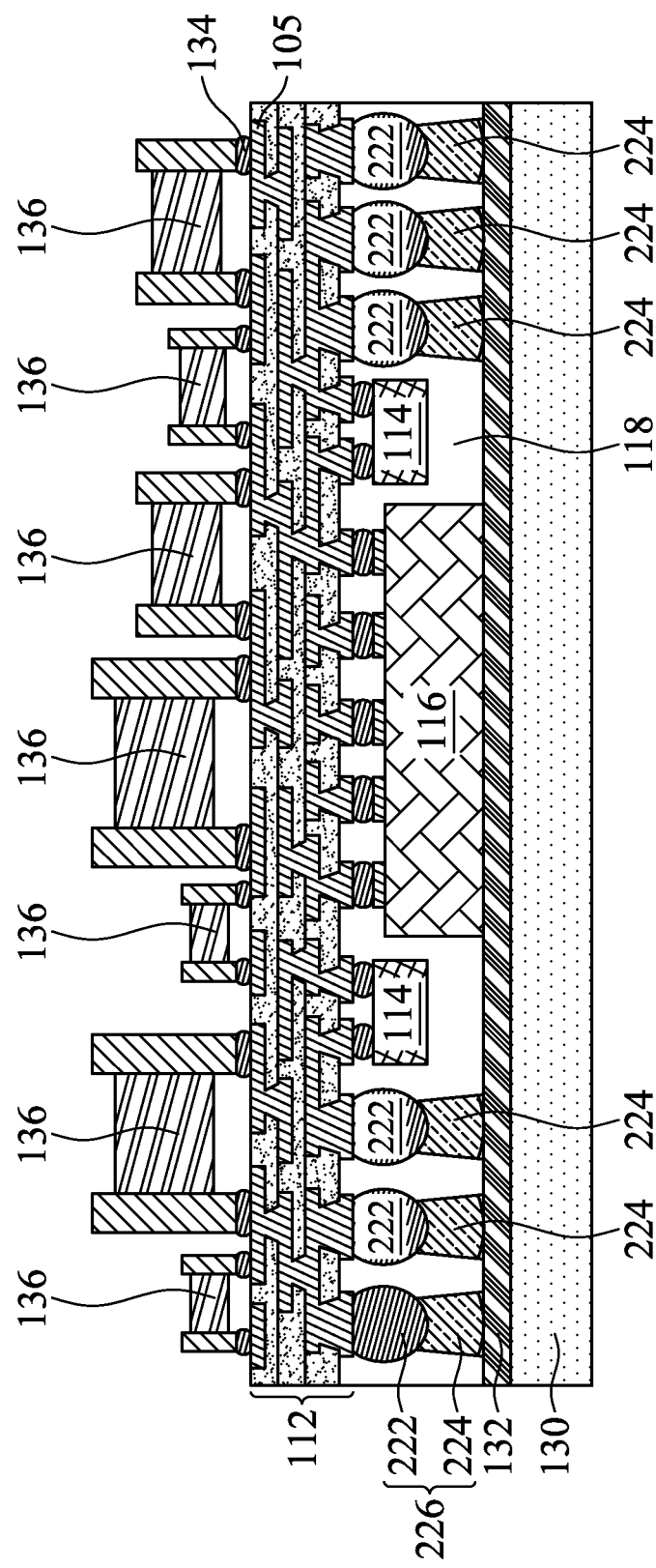

In FIG. 23, conductive connectors 134 are formed on the redistribution structure 112, and integrated devices 136 are attached to the conductive connectors 134, in accordance with some embodiments. The conductive connectors 134 may be similar to the conductive connectors 134 described previously for FIG. 9, and may be formed in a similar manner. The integrated devices 136 may be similar to the integrated devices 136 described previously for FIG. 10, and may be attached in a similar manner.

Figure 24:
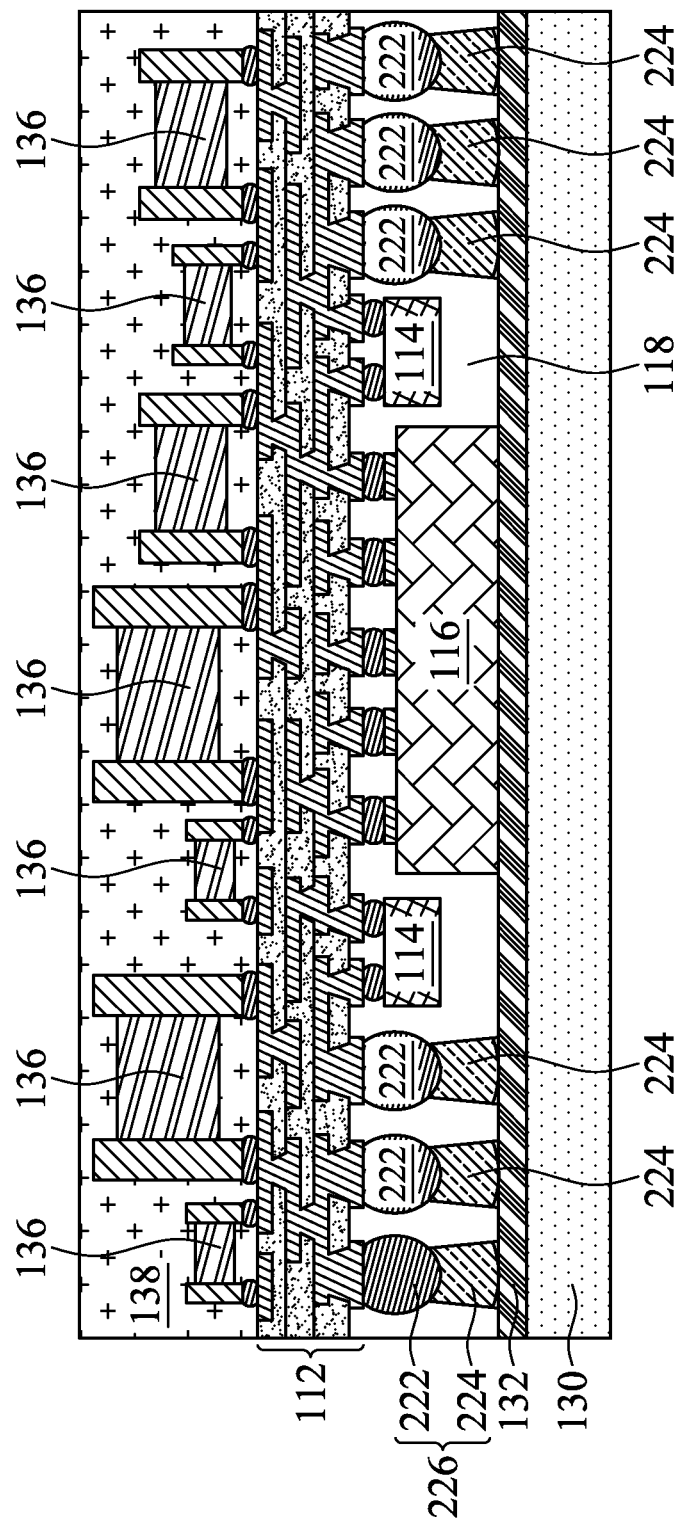

In FIG. 24, a second encapsulant 138 is formed over the redistribution structure 112 to encapsulate the integrated devices 136, in accordance with some embodiments. The second encapsulant 138 may be a material similar to that described previously for FIG. 11, and may be formed in a similar manner. In some embodiments, the second encapsulant 138 is planarized (e.g., using a CMP and/or grinding process), which may expose at least one integrated device 136.

Figure 25:
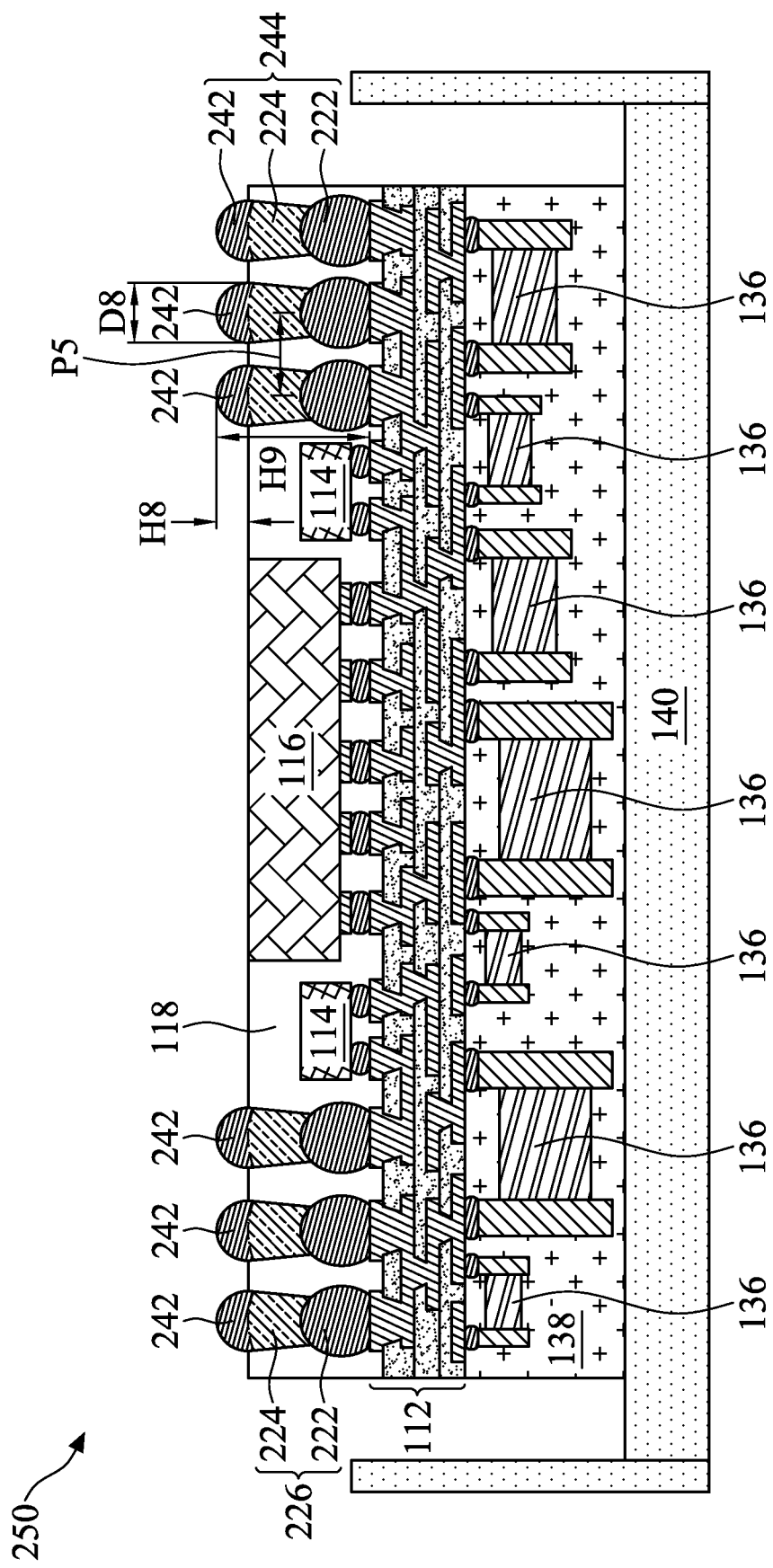

In FIG. 25, a carrier substrate de-bonding is performed to detach (or "de-bond") the second carrier substrate 130 from the structure, e.g., the first encapsulant 118. The structure may then be flipped over and placed on a carrier 140, which may be, for example, a tape, a frame, or the like. The detaching of the second carrier substrate 130 and the attaching to the carrier 140 may be similar to the steps described previously for FIG. 12. After attaching the structure to the carrier 140, a solder material 242 may be formed on the interconnect stacks 226 to form interconnects 244. In this manner, a package structure 250 may be formed, in accordance with some embodiments.

The solder material 242, the first conductive material 222, and the second conductive material 224 together form interconnects 244 that extend through the first encapsulant 118 and are electrically connected to the redistribution structure 112 of the package structure 250. In the embodiment shown in FIG. 25, the package structure 250 includes a first encapsulant 118 on a first side of a redistribution structure 112, interconnects 244 extending through the first encapsulant 118 to the first side of the redistribution structure 112, and a second encapsulant 138 on a second side of the redistribution structure 112. The solder material 242 may be a similar material as the solder material 142 described previously, and may be formed in a similar manner. The solder material 242, the conductive material 122, and/or the second conductive material 224 have the same composition or may have different compositions. In some embodiments, a reflow process may be performed after forming the solder material 242. In other embodiments, solder material 242 is not used.

In some embodiments, the solder material 242 may protrude a height H8 above a top surface of the first encapsulant 118 that is in a range between about 50 µm and about 100 µm, though other heights are possible. The interconnects 244 may have a total height H9 that is in a range between about 150 µm and about 1050 µm, though other heights are possible. In some cases, the solder material 242 may extend over a top surface of the first encapsulant 118 and/or below a top surface of the first encapsulant 118. In some embodiments, the solder material 242 may have a width D8 that is in a range between about 80 µm and about 450 µm, though other widths are possible. The width D8 may be greater than, about the same, or less than the top width D7 of the openings 220 (see FIG. 20). The interconnects 244 may have an aspect ratio (e.g., H9:D5) that is in a range between about 1.5:1 and about 2:1, though other aspect ratios are possible. In some cases, the techniques described herein allow for interconnects 244 of a package structure to be formed having a smaller pitch without increased risk of bridging. This can allow for a greater density of interconnects 244 and thus can allow for greater flexibility of design, a greater number of interconnects, smaller size, or improved performance of a package structure. In some embodiments, the interconnects 244 may be formed having a pitch P5 that is in a range between about 150 µm and about 700 µm, though other pitches are possible. The pitch P5 may be about the same as the pitch P4 of the openings 220 (see FIG. 20). In some embodiments, multiple package structures 250 may be formed on the same carrier (e.g., carriers 102, 130, and/or 140) and then singulated to form individual package structures 250. In this manner, a package structure 250 may be formed having interconnects 244 comprising an interconnect stack 226 that extends through the first encapsulant 118 to connect to a redistribution structure 112.

Figure 26A:
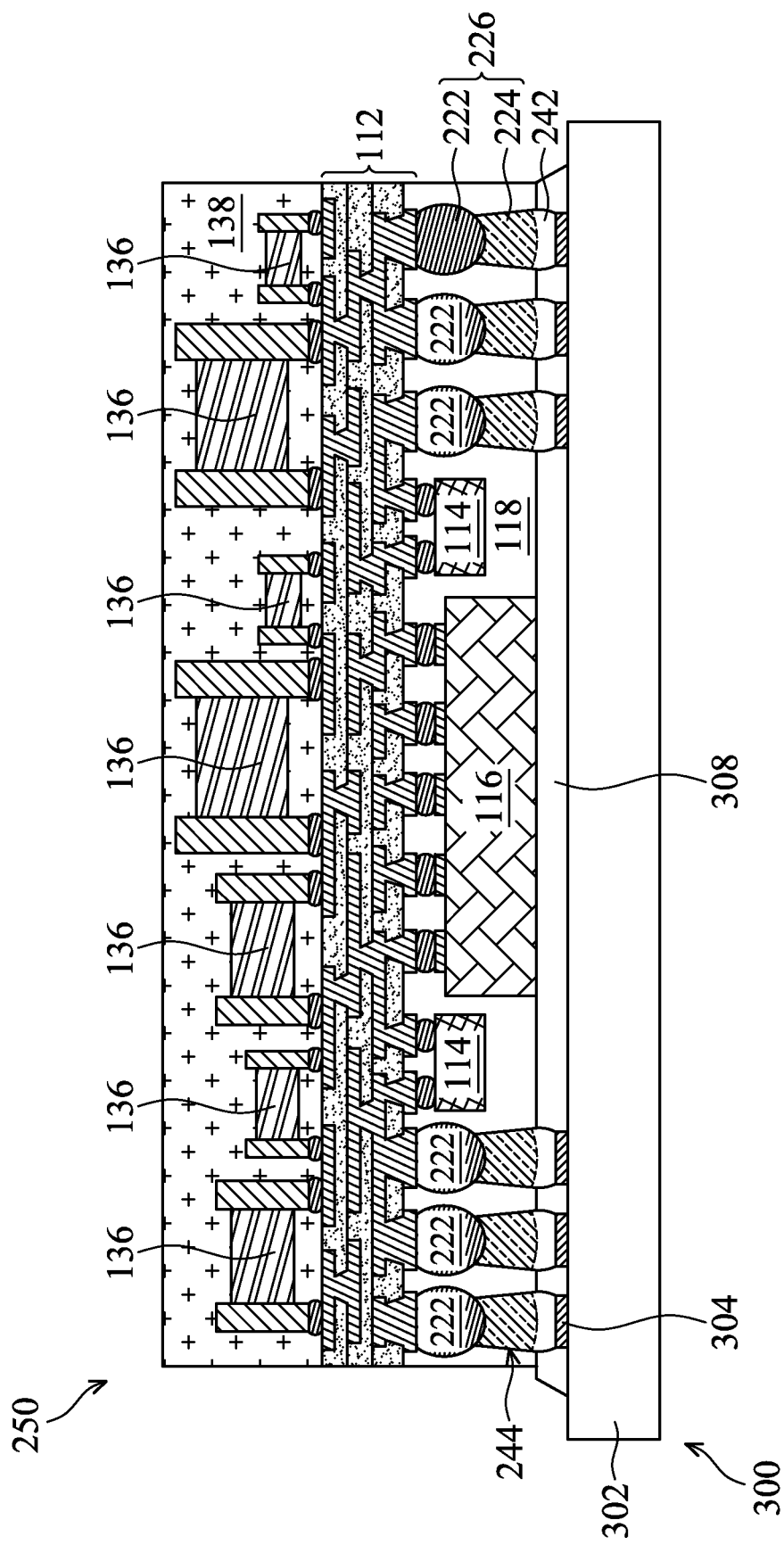
Figure 26B:
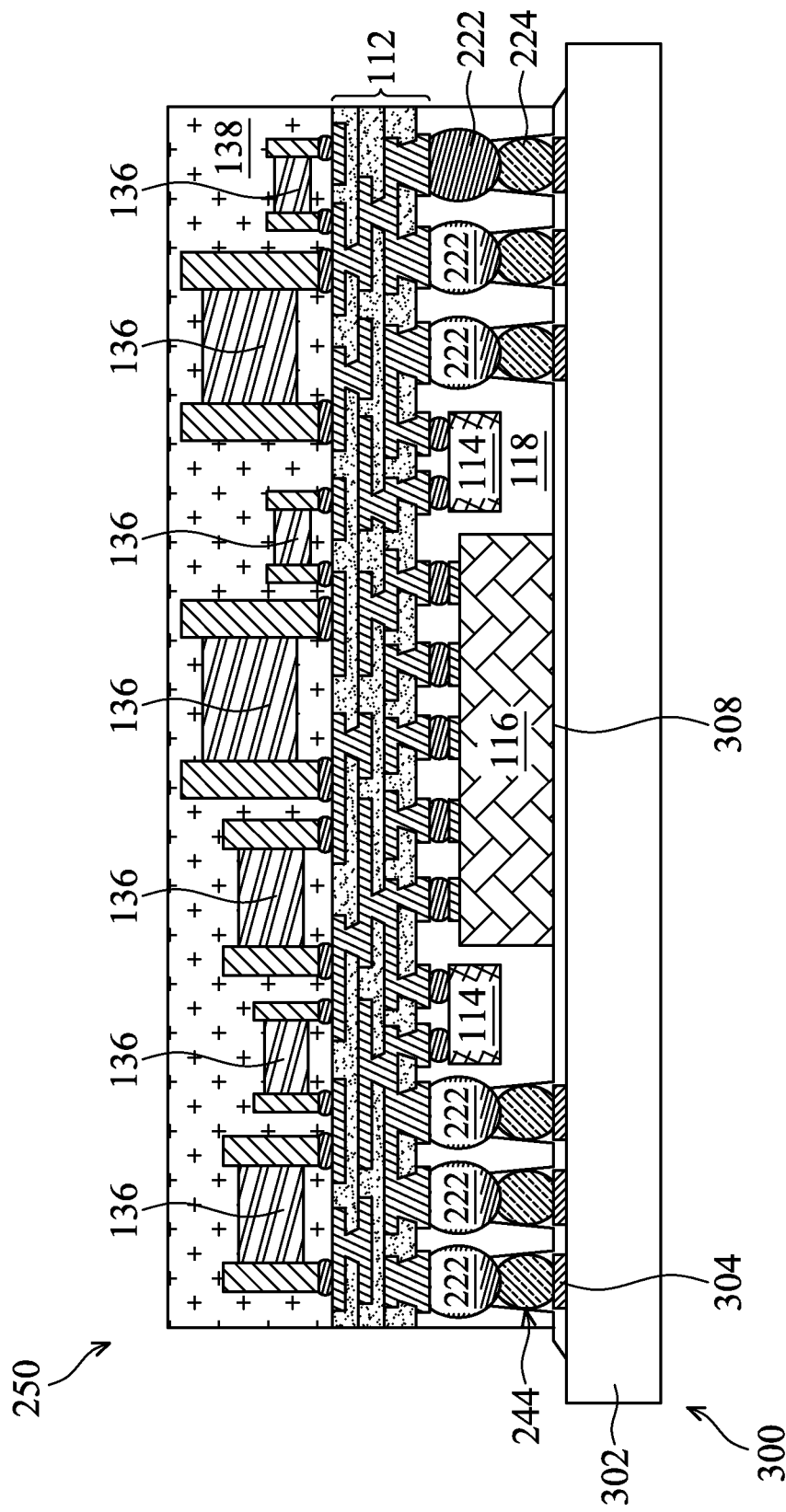

Turning to FIGS. 26A-B, each singulated package structure 250 may be attached to an external component, in accordance with some embodiments. FIGS. 26A-B shows examples in which a package structure 250 is attached to a package substrate 300, which may be similar to the package substrate 300 shown previously for FIG. 16. For example, package substrate 300 may include a substrate core 302 and bond pads 304 over the substrate core 302. FIG. 26A illustrates an embodiment in which the second conductive material 224 of the interconnects 244 comprises a conductive paste (see FIG. 21A), and FIG. 26B illustrates an embodiment in which the second conductive material 224 of the interconnects 244 comprises solder balls (see FIG. 21B). Additionally, FIG. 26B illustrates an embodiment in which the solder material 242 is not used, but a solder material 242 may be used or not used in either embodiment of FIGS. 26A-B, or in other embodiments discussed herein.

In some embodiments, the package structure 150 is placed on the package substrate 300 such that the interconnects 244 of the package structure 150 are aligned with the bond pads 304 of the package substrate, and then the interconnects 244 are reflowed to attach the package structure 150 to the package substrate 300. The interconnects 244 electrically and/or physically couple the package structure 150, including metallization layers in the redistribution structure 112, to the package substrate 300. In some embodiments, an underfill 308 may be formed between the package structure 150 and the package substrate 300 and surrounding the interconnects 144.

Referring to FIG. 26A, in some embodiments, the solder material 242 is first formed on the second conductive material 224 of the interconnects 244 (see FIG. 25), and then the solder material 242 is placed on the bond pads 304 of the package substrate 300 and reflowed. In other embodiments, the solder material 242 is first formed on the bond pads 304 of the package substrate 300, and then the second conductive material 224 (e.g., a conductive paste) is placed on the solder material 242 and reflowed. Referring to FIG. 26B, in some embodiments, the second conductive material 224 (e.g., solder balls) is first formed on the first conductive material 222 of the interconnects 244 (see FIG. 21B), and then the second conductive material 224 is placed on the bond pads 304 of the package substrate 300 and reflowed. In other embodiments, the second conductive material 224 is first formed on the bond pads 304 of the package substrate 300, and then the first conductive material 222 is placed on the second conductive material 224 and reflowed.

According to embodiments disclosed herein, System-in-Package (SiP) devices may be fabricated using heterogeneous devices and asymmetric dual-side molding on a multi-layered redistribution layers (RDL) structure, using interconnects extending through the molding of one side to connect to the RDL structure. The interconnects may be formed as through-molding vias (TMVs). The embodiments disclosed herein can allow for interconnects to be formed having a finer pitch, thus increasing connection density and improved device performance. For example, the number or density of input/output connections of a package structure may be increased, improving performance of the package structure or connected devices. The interconnects may be formed having a finer pitch without increased risk of bridging or other defects, and thus yield may be improved. In some embodiments, each interconnect may be formed as a single interconnect structure comprising, e.g., conductive paste. In other embodiments, each interconnects may be formed as an interconnect structure comprising a stack of a conductive materials, such as a solder ball on another solder ball or as conductive paste formed on a solder ball. Additionally, the techniques described herein allow for flexibility of molding material choices (e.g., the CTEs of the molding on each side) and molding thickness (e.g., the thickness of the molding on each side), which can be controlled to reduce warping of the final device.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

In accordance with an embodiment, a method includes forming a redistribution structure including metallization patterns; attaching a semiconductor device to a first side of the redistribution structure; encapsulating the semiconductor device with a first encapsulant; forming openings in the first encapsulant, the openings exposing a metallization pattern of the redistribution structure; forming a conductive material in the openings, comprising at least partially filling the openings with a conductive paste; after forming the conductive material, attaching integrated devices to a second side of the redistribution structure; encapsulating the integrated devices with a second encapsulant; and after encapsulating the integrated devices, forming a pre-solder material on the conductive material. In an embodiment, a coefficient of thermal expansion (CTE) of the first encapsulant is different from a CTE of the second encapsulant. In an embodiment, after encapsulating the integrated devices, the integrated devices protrude from the second encapsulant. In an embodiment, forming openings in the first encapsulant includes performing a laser drilling process. In an embodiment, the conductive paste is a silver paste. In an embodiment, the integrated devices include surface-mount devices (SMDs). In an embodiment, the method includes performing a planarization process on the first encapsulant to expose the semiconductor device. In an embodiment, forming openings in the first encapsulant includes performing a laser drilling process.

In accordance with an embodiment, a method includes forming a redistribution structure including a first metallization pattern and a second metallization pattern; connecting a first set of integrated devices to the first metallization pattern; forming conductive connectors on the first metallization pattern; depositing a first molding material over the first metallization pattern, the first set of integrated devices, and the conductive connectors; forming openings in the first molding material using a laser drilling process, wherein each opening exposes a conductive connector; forming conductive material within each opening and on each conductive connector; connecting a second set of integrated devices to the second metallization pattern; and depositing a second molding material over the second metallization pattern and the second set of integrated devices. In an embodiment, forming the conductive material includes depositing a solder paste within each opening. In an embodiment, forming the conductive material includes placing a solder ball within each opening. In an embodiment, after depositing the second molding material, at least one integrated device of the second set of integrated devices is exposed. In an embodiment, the conductive connectors include solder balls. In an embodiment, the first molding material has a different composition than the second molding material.

In accordance with an embodiment, a device includes a redistribution structure including a first side and a second side; first devices attached to the first side of the redistribution structure; a first molding material on the first side of the redistribution structure and surrounding the first devices; openings in the first molding material; conductive interconnects in the openings, wherein each conductive interconnect is electrically connected to the first side of the redistribution structure, wherein each conductive interconnect includes solder paste that at least partially fills a respective opening; second devices attached to the second side of the redistribution structure; and a second molding material on the second side of the redistribution structure and surrounding the second devices, wherein the second molding material is different than the first molding material. In an embodiment, each conductive interconnect has an aspect ratio in the range between 1:8 and 1:10. In an embodiment, the conductive interconnects have a pitch in the range between 100 μm and 250 μm. In an embodiment, each conductive interconnect includes solder balls, wherein each solder ball is within a respective opening, wherein each solder ball physically and electrically contacts the first side of the first redistribution structure, wherein the solder paste of the conductive interconnects is disposed on each solder balls. In an embodiment, the device includes a pre-solder material on the conductive interconnects. In an embodiment, a ratio of a thickness of the first molding material to a thickness of the second molding material is in the range between 1:1 and 1:8.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    connecting a first device to a first side of a redistribution structure;
    placing a first solder ball on the first side of the redistribution structure adjacent the first device;
    encapsulating the first device and the first solder ball using a first encapsulant;
    forming an opening in the encapsulant to expose the first solder ball; and
    connecting a package substrate to the first solder ball, wherein the package substrate is connected to the first solder ball by a second solder ball that physically contacts the first solder ball, wherein the encapsulant extends farther from the package substrate than the first solder ball, wherein surfaces of the encapsulant, the first device, and the second solder ball are coplanar.

2. The method of claim 1 further comprising performing a reflow process on the first solder ball and the second solder ball.

3. The method of claim 1, wherein connecting the package substrate to the first solder ball comprises placing the second solder ball on the package substrate and then placing the first solder ball on the second solder ball.

4. The method of claim 1, wherein connecting the package substrate to the first solder ball comprises placing the second solder ball on the first solder ball and then placing the second solder ball on the package substrate.

5. The method of claim 1 further comprising connecting a second device to a second side of the redistribution structure and then encapsulating the second device using a second encapsulant.

6. The method of claim 1, wherein a width of the opening is less than a width of the first solder ball.

7. The method of claim 1, wherein surfaces of the encapsulant and the first device directly contact the package substrate.

8. The method of claim 1, wherein forming the opening comprises a laser drilling process.

9. A method comprising:
forming a redistribution structure comprising a plurality of metallization patterns;
bonding a plurality of first devices to a first metallization pattern of the plurality of metallization patterns;
forming a plurality of first solder balls on the first metallization pattern;
covering the plurality of first devices and the plurality of first solder balls with a first molding material;
forming a plurality of openings in the first molding material, wherein each opening exposes a respective first solder ball; and
bonding the redistribution structure to a substrate, comprising:
placing a plurality of second solder balls on the substrate; and
placing the plurality of first solder balls on the plurality of second solder balls to form a plurality of interconnect stacks, wherein each interconnect stack comprises a first solder ball on a respective second solder ball, wherein the first solder ball and the second solder ball of each interconnect stack are surrounded by the first molding material, wherein a height of the plurality of interconnect stacks is less than a thickness of the first molding material.

10. The method of claim 9, wherein the substrate physically contacts the first molding material and at least one first device of the plurality of first devices.

11. The method of claim 9, wherein a thickness of the plurality of first solder balls is in the range of 50% to 70% of a thickness of the first molding material.

12. The method of claim 9, wherein a height of the plurality of openings is in the range of 50% to 70% of a thickness of the first molding material.

13. The method of claim 9 further comprising performing a reflow process on the plurality of interconnect stacks.

14. The method of claim 9, wherein the first molding material physically contacts a sidewall of the first metallization pattern.

15. The method of claim 9 further comprising:
bonding a plurality of second devices to a second metallization pattern of the plurality of metallization patterns; and
covering the plurality of second devices with a second molding material.

16. The method of claim 9, wherein placing the plurality of first solder balls on the plurality of second solder balls is performed after placing the plurality of second solder balls on the substrate.

17. The method of claim 9, wherein the second solder balls are smaller than the first solder balls.

18. A method comprising:
attaching first devices to a first side of a redistribution structure;
attaching second devices to first bond pads disposed on a second side of the redistribution structure;
placing first solder balls on second bond pads disposed on the second side of the redistribution structure;
depositing a first encapsulant on the first side of the redistribution structure, wherein the first encapsulant laterally surrounds the first devices;
depositing a second encapsulant on the second side of the redistribution structure, wherein the second encapsulant laterally surrounds the second devices, the first solder balls, the first bond pads, and the second bond pads;
removing portions of the second encapsulant to expose each first solder ball;
attaching a second solder ball to each first solder ball, wherein the second encapsulant laterally surrounds each second solder ball, wherein a height of the second solder balls is greater than a height of the first solder balls; and
bonding conductive pads of a package to the second solder balls, wherein the second encapsulant physically contacts the package.

19. The method of claim 18, wherein a width of each second solder ball is less than a width of each first solder ball.

20. The method of claim 18, wherein the height of the second solder balls is less than a height of the second devices.

* * * * *